(12) United States Patent
Ichiryu et al.

(10) Patent No.: US 9,860,979 B2
(45) Date of Patent: Jan. 2, 2018

(54) STRETCHABLE FLEXIBLE SUBSTRATE INCLUDING FIRST INSULATING LAYER, SECOND INSULATING LAYER, FIRST METAL LAYER, AND SECOND METAL LAYER

(71) Applicant: Panasonic Intellectual Property Management Co., Ltd., Osaka (JP)

(72) Inventors: Takashi Ichiryu, Osaka (JP); Koji Kawakita, Nara (JP); Masanori Nomura, Osaka (JP); Yoshihiro Tomita, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 85 days.

(21) Appl. No.: 15/158,591

(22) Filed: May 19, 2016

(65) Prior Publication Data
US 2016/0353567 A1 Dec. 1, 2016

(30) Foreign Application Priority Data
May 25, 2015 (JP) .................... 2015-105757

(51) Int. Cl.
*H05K 1/00* (2006.01)
*H05K 1/02* (2006.01)
*H05K 1/18* (2006.01)

(52) U.S. Cl.
CPC .......... *H05K 1/0283* (2013.01); *H05K 1/185* (2013.01); *H05K 2201/10151* (2013.01)

(58) Field of Classification Search
CPC ..... H05K 1/0283; H05K 1/0277; H05K 1/028
(Continued)

(56) References Cited

U.S. PATENT DOCUMENTS 8,332,053 B1 * 12/2012 Patterson ............ H01L 23/5387
600/393
2012/0051005 A1 * 3/2012 Vanfleteren ........... H01L 21/565
361/749

(Continued)

FOREIGN PATENT DOCUMENTS

| JP | 2004-071562 | 3/2004 |
|----|-------------|--------|
| JP | 2004-349002 | 12/2004 |

(Continued)

*Primary Examiner* — Steven T Sawyer
(74) *Attorney, Agent, or Firm* — McDermott Will & Emery LLP

(57) ABSTRACT

A stretchable flexible substrate according to one aspect of the present disclosure includes: an electronic component; a first insulating layer located around the electronic component and having first and second main surfaces facing each other; a first metal layer that is in contact with the first main surface; a second metal layer that is in contact with the second main surface and electrically connected to the electronic component; and a second insulating layer that seals the electronic component, first insulating layer, and second metal layer, in plan view, a curved wiring portion extending from a central portion made up of at least the electronic component, portions of the first insulating layer and first and second metal layers, the curved wiring portion being made up of at least other portions of the first insulating layer, first and second metal layers, and the curved wiring portion being curved at least partially.

12 Claims, 20 Drawing Sheets

(58) Field of Classification Search
USPC .......................................... 174/255, 254, 257
See application file for complete search history.

(56) References Cited

U.S. PATENT DOCUMENTS

| | | | |
|---|---|---|---|
| 2012/0052268 A1* | 3/2012 | Axisa ................ | H01L 23/49838 428/212 |
| 2012/0103683 A1 | 5/2012 | Ishida | |
| 2013/0319740 A1 | 12/2013 | Sato et al. | |
| 2014/0104793 A1* | 4/2014 | Park .................... | H05K 1/0283 361/749 |
| 2014/0299362 A1* | 10/2014 | Park .................... | H05K 1/0283 174/254 |
| 2015/0041201 A1* | 2/2015 | Van Heck ............... | H05K 1/09 174/260 |
| 2015/0173186 A1* | 6/2015 | Na ....................... | H05K 1/0283 174/254 |

FOREIGN PATENT DOCUMENTS

| | | |
|---|---|---|
| JP | 2008-010368 | 1/2008 |
| JP | 2010-098064 | 4/2010 |
| JP | 2013-145842 | 7/2013 |
| JP | 2013-195331 | 9/2013 |
| JP | 2013-247353 | 12/2013 |
| JP | 2014-162124 | 9/2014 |
| JP | 2014-162125 | 9/2014 |
| WO | 2011/007486 | 1/2011 |

* cited by examiner ated by the various embodiments and features of the specification and drawings, which need not all be provided in order to obtain one or more of such benefits and/or advantages.

STRETCHABLE FLEXIBLE SUBSTRATE INCLUDING FIRST INSULATING LAYER, SECOND INSULATING LAYER, FIRST METAL LAYER, AND SECOND METAL LAYER

BACKGROUND

1. Technical Field

The present disclosure relates to a stretchable flexible substrate and a method for producing the same.

2. Description of the Related Art

In recent years, a flexible substrate having flexibility is often used along with a reduction in size and thickness of electronic devices. Use of a substrate having a flexible property in not only mobile apparatuses, which have been required to be reduced in size, but also other various apparatuses is being considered. For example, use of such a substrate having a flexible property in wearable apparatuses and the like that require a flexible property so as to synchronize with user's movement is being considered.

Examples of assumed wearable apparatuses include sensor devices that achieve high-precision sensing by being brought into close contact with a human body and display devices that synchronize with human body movement and fit into three-dimensional concavities and convexities. Such devices are required to be attached onto joints and movable parts of human bodies without causing a discomfort feeling, and therefore importance is placed on a wearing feeling, design, and the like that match user's movement. Accordingly, flexible substrates applied to wearable apparatuses are required to have not only flexibility but also stretchability. Background arts are disclosed, for example, in Japanese Unexamined Patent Application Publication No. 2004-71562, Japanese Unexamined Patent Application Publication No. 2004-349002, Japanese Unexamined Patent Application Publication No. 2013-145842, and Japanese Unexamined Patent Application Publication No. 2014-162124.

SUMMARY

In one general aspect, the techniques disclosed here feature a stretchable flexible substrate including: an electronic component; a first insulating layer that is located around the electronic component and has a first main surface and a second main surface that face each other; a first metal layer that is in contact with the first main surface; a second metal layer that is in contact with the second main surface and is electrically connected to the electronic component; and a second insulating layer that seals the electronic component, the first insulating layer, and the second metal layer, wherein in plan view, at least one curved wiring portion extends from a central portion, the central portion being made up of at least the electronic component, a first portion of the first insulating layer, a first portion of the first metal layer and a first portion of the second metal layer, and the at least one curved wiring portion being made up of at least a second portion of the first insulating layer that is different from the first portion, a second portion of the first metal layer that is different from the first portion, and a second portion of the second metal layer that is different from the first portion, and the at least one curved wiring portion is curved at least partially.

Additional benefits and advantages of the disclosed embodiments will become apparent from the specification and drawings. The benefits and/or advantages may be indi-

DETAILED DESCRIPTION

Figure 1:
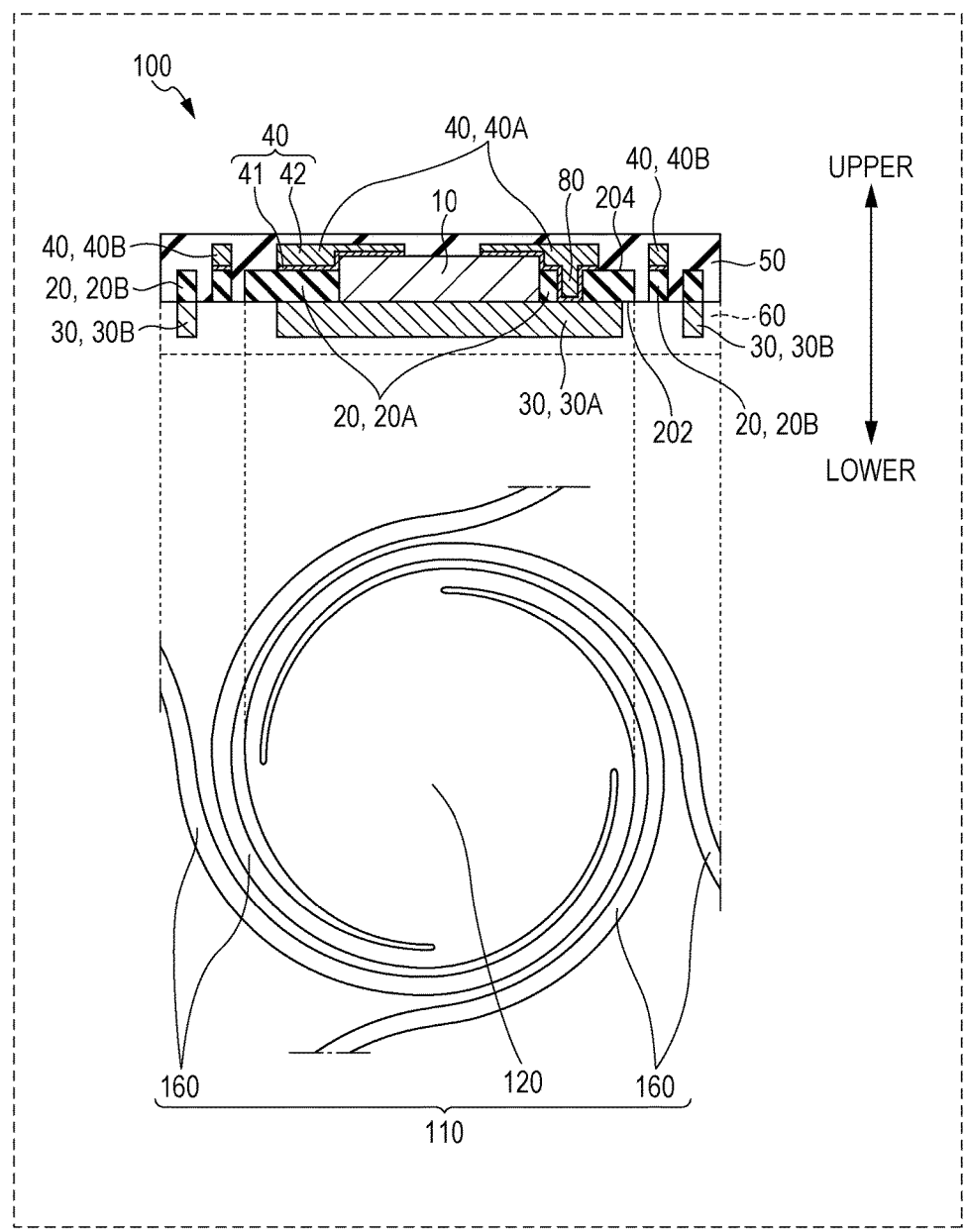
FIG. 1 is a schematic view schematically illustrating a configuration of a stretchable flexible substrate according to the present disclosure.

Underlying Knowledge Forming Basis of the Present Disclosure

The inventors of the present disclosure found that conventional flexible substrates need further improvements, and accomplished the present disclosure on the basis of this finding. Specifically, the inventors of the present disclosure found that an active attempt to give stretchability to a flexible substrate can arouse concerns specific to "stretchability". In particular, production of a stretchable substrate involves difficulties specific to "stretchability", for example, a difficulty in mounting of parts.

A conventionally proposed flexible substrate has flexibility in response to a demand for "stretchability" and is configured so that a wiring portion has a meandering shape. However, since such a flexible substrate uses a bent wiring portion, stress is likely to focus on a bent portion when the substrate is stretched. Accordingly, there is a risk of breaking of the wiring portion when stretch and contraction of the substrate are repeated. Furthermore, although such a flexible substrate is stretchable in a direction in which the flexible substrate extends, the flexible substrate is hard to stretch in a direction different from the direction in which the flexible substrate extends. Therefore, it is hard to say that the conventionally proposed flexible substrate has sufficient stretchability as a wearable apparatus although the conventionally proposed flexible substrate has flexibility.

Furthermore, the conventional flexible substrate has relatively large restrictions in terms of a production method thereof. Specifically, the flexible substrate is produced by using a material having higher stretchability in order to improve stretchability of the flexible substrate, but the used material is required to have resistance to heat that is equal to or higher than a reflow temperature in view of a part mounting step. Furthermore, there are cases where an electronic component is mounted on the substrate at a position deviated from a designed position due to "stretchability", and therefore there is a concern that it can be difficult to, for example, finely mount a part.

The present disclosure includes a stretchable flexible substrate and a method for producing the same described in the following items.

Item 1

A stretchable flexible substrate including:

an electronic component;

a first insulating layer that is located around the electronic component and has a first main surface and a second main surface that face each other;

a first metal layer that is in contact with the first main surface;

a second metal layer that is in contact with the second main surface and is electrically connected to the electronic component; and a second insulating layer that seals the electronic component, the first insulating layer, and the second metal layer, wherein:

in plan view, at least one curved wiring portion extends from a central portion, the central portion being made up of at least the electronic component, a first portion of the first insulating layer, a first portion of the first metal layer and a first portion of the second metal layer, and the at least one curved wiring portion being made up of at least a second portion of the first insulating layer that is different from the first portion, a second portion of the first metal layer that is different from the first portion, and a second portion of the second metal layer that is different from the first portion; and the at least one curved wiring portion is curved at least partially.

The stretchable flexible substrate according to the aspect of the present disclosure may be arranged such that the at least one curved wiring portion includes a plurality of curved wiring portions.

Item 2

The stretchable flexible substrate according to Item 1, wherein the stretchable flexible substrate is stretchable due to a change in curvature of the at least one curved wiring portion.

Item 3

The stretchable flexible substrate according to Item 1 or 2, wherein in the central portion, the electronic component is surrounded by the first portion of the first insulating layer.

Item 4

The stretchable flexible substrate according to any one of Items 1 through 3, further including an adhesive layer that is provided between the electronic component and the first metal layer and is in contact with the electronic component.

Item 5

The stretchable flexible substrate according to any one of Items 1 through 4, wherein the first metal layer is a metal foil.

Item 6

The stretchable flexible substrate according to any one of Items 1 through 5, wherein both of the first insulating layer and the second insulating layer are each a resin layer; and the second insulating layer is softer than the first insulating layer.

Item 7

The stretchable flexible substrate according to any one of Items 1 through 6, further including a third insulating layer that seals the first metal layer, wherein the second insulating layer is stacked on the third insulating layer.

Item 8

The stretchable flexible substrate according to Item 7, wherein the first metal layer is flush with a boundary face between the second insulating layer and the third insulating layer.

Item 9

The stretchable flexible substrate according to Item 7 or 8, wherein the first insulating layer is flush with a boundary face between the second insulating layer and the third insulating layer.

Item 10

The stretchable flexible substrate according to Item 4, further including a third insulating layer that seals the first metal layer, wherein:

the second insulating layer is stacked on the third insulating layer; and the adhesive layer is flush with a boundary face between the second insulating layer and the third insulating layer.

Item 11

The stretchable flexible substrate according to any one of Items 7 through 10, wherein both of the first insulating layer and the third insulating layer are each a resin layer; and the third insulating layer is softer than the first insulating layer.

Item 12

The stretchable flexible substrate according to any one of Items 1 through 11, further including a gap that passes through the first insulating layer, wherein the first metal layer and the second metal layer are electrically connected to each other through the gap.

Item 13

The stretchable flexible substrate according to Item 12, wherein the gap is filled with the second metal layer.

Item 14

A method for producing a stretchable flexible substrate, including:

(i) providing, on a precursor member of a first metal layer, a first insulating layer that has a hollow region and at least one curved portion that extends so as to be curved about the hollow region;

(ii) disposing an electronic component in the hollow region;

(iii) forming a second metal layer by performing a plating process and then performing a first patterning process on a plating layer formed by the plating process;

(iv) forming a second insulating layer on the precursor member so that the second insulating layer seals the electronic component, the first insulating layer, and the second metal layer; and (v) obtaining a first metal layer by performing a second patterning process on the precursor member.

In the method for producing a stretchable flexible substrate according to one aspect of the present disclosure may be arranged such that the at least one curved portion includes curved portions.

Item 15

The method for producing a stretchable flexible substrate according to Item 14, wherein a metal foil is used as the precursor member in the step (i).

Item 16

The method for producing a stretchable flexible substrate according to Item 14 or 15, wherein both of the first insulating layer and the second insulating layer are formed as a resin layer; and the second insulating layer is made of a softer resin material than the first insulating layer.

Item 17

The method for producing a stretchable flexible substrate according to any one of Items 14 through 16, further including, after the step (v), forming a third insulating layer so that the third insulating layer seals the first metal layer.

Item 18

The method for producing a stretchable flexible substrate according to Item 17, wherein both of the first insulating layer and the third insulating layer are formed as a resin layer; and the third insulating layer is made of a softer resin material than the first insulating layer.

Item 19

The method for producing a stretchable flexible substrate according to any one of Items 14 through 18, wherein in the step (ii), after an adhesive layer is formed in the hollow region, the electronic component is disposed so as to be in contact with the adhesive layer.

Item 20

The method for producing a stretchable flexible substrate according to any one of Items 14 through 19, wherein as the plating process in the step (iii), a dry plating method is performed, and then a wet plating method is performed.

Item 21

The method for producing a stretchable flexible substrate according to any one of Items 14 through 20, wherein in the step (iii), the first metal layer and the second metal layer are connected to each other in a gap of the first insulating layer formed by the at least one curved portion by forming the second metal layer so that the second metal layer fills the gap.

Item 22

The method for producing a stretchable flexible substrate according to any one of Items 14 through 21, wherein the step (v) is performed before the step (iv).

Item 23

The method for producing a stretchable flexible substrate according to Item 22, wherein the first patterning process in the step (iii) and the second patterning process in the step (v) are collectively performed.

One of characteristics of the stretchable flexible substrate according to one aspect of the present disclosure is that a first metal layer and a second metal layer are provided so as to be in contact with both surfaces of an insulating layer located around an electronic component and that another insulating layer that seals the insulating layer, the electronic component, and the second metal layer is provided.

One of characteristics of the method for producing a stretchable flexible substrate according to one aspect of the present disclosure lies in formation of a first insulating layer having a unique form on a precursor member of a first metal layer and in subsequent steps performed in association with this. Specifically, one of characteristics of the method for producing a stretchable flexible substrate according to one aspect of the present disclosure lies in formation, on a precursor member of a first metal layer, of a first insulating layer that has a hollow region and a curved portion extending so as to be curved about the hollow region and in subsequent steps performed on the precursor member of the first metal layer and the first insulating layer.

The present disclosure is helpful for suitable realization of a stretchable flexible substrate. Specifically, in a conventional flexible substrate in which a wiring portion is bent in a meandering shape, stress is concentrated on one point, i.e., a bent portion when the meandering shape is stretched, thereby causing breaking of a copper foil pattern, whereas in the stretchable flexible substrate according to one aspect of the present disclosure, when the stretchable flexible substrate is stretched, a wound-up state of a curved wiring portion changes so that the curved wiring portion is unwound from the outer periphery, and therefore the stretchable flexible substrate is stretched without a problem, i.e., without concentration of stress on specific one point. Furthermore, the degree of stretchability of the wiring can be made large by increasing the number of turns of the curved wiring portion.

In the method for producing a stretchable flexible substrate according to one aspect of the present disclosure, a difficulty that accompanies production of a stretchable flexible substrate is lessened, for example, a difficulty in terms of mounting of parts is lessened. More specifically, in mounting of electronic components, since "a hollow region" corresponding to "a recess" is provided in a region in which an electronic component is to be mounted, positional deviation in a mounting step is lessened, and falling of the electronic component can be suppressed. In other words, the production method according to one aspect of the present disclosure makes it possible to prevent an electronic component from falling and being deviated from a correct position during production, and is therefore helpful for production of a highly reliable stretchable flexible substrate.

Furthermore, in a conventional flexible substrate, only a material having resistance to heat equal to or higher than a temperature in a reflow process is used, but in the method for producing a stretchable flexible substrate according to one aspect of the present disclosure, such restriction of a material is lessened. Specifically, in the method for producing a stretchable flexible substrate according to one aspect of the present disclosure, use of solder connection is unnecessary, and therefore even a material that does not have reflow heat resistance can be used.

A stretchable flexible substrate and a method for producing the stretchable flexible substrate according to one aspect of the present disclosure are described below in detail. Note that various elements illustrated in the drawings are merely schematically illustrated for understanding of the present disclosure, and a dimensional ratio, appearance, and the like can be different from actual ones.

Flexible Substrate of Present Disclosure

FIG. 1 schematically illustrates a configuration of a stretchable flexible substrate according to the present disclosure. As illustrated in FIG. 1, a stretchable flexible substrate 100 according to the present disclosure includes an electronic component 10, a first insulating layer 20, a first metal layer 30, a second metal layer 40, and a second insulating layer 50.

The first insulating layer 20 is located around the electronic component 10 and has a first main surface 202 and a second main surface 204 that face each other. The first metal layer 30 is provided so as to be in contact with the first main surface 202 of the first insulating layer 20. Meanwhile, the second metal layer 40 is provided so as to be in contact with the second main surface 204 of the first insulating layer 20 and is electrically connected to the electronic component 10. In the aspect illustrated in FIG. 1, the first metal layer 30 is provided on a lower main surface of the first insulating layer 20, and the second metal layer 40 is provided on an upper main surface of the first insulating layer 20. The second insulating layer 50 is provided so as to seal the electronic component 10, the first insulating layer 20, and the second metal layer 40.

The stretchable flexible substrate 100 according to the present disclosure is arranged such that the various constituent elements are stacked and disposed in a suitable relationship so as to exhibit "stretchability". That is, the electronic component 10, the first insulating layer 20, the first metal layer 30, the second metal layer 40, and the second insulating layer 50 are suitably disposed and stacked.

The stretchable flexible substrate 100 according to the present disclosure exhibits "stretchability" and has at least one coil-like form as a whole, as is clear from the aspect illustrated in FIG. 1. That is, the stretchable flexible substrate 100 includes a unit wiring structure 110 as illustrated in the lower portion of FIG. 1. More specifically, the stretchable flexible substrate 100 has a unit wiring structure 110 that is made up of a "central portion 120" and a "curved wiring portion 160 that extends from the central portion 120 so as to be curved outward". That is, the unit wiring structure 110 is made up of the "central portion 120" and the "curved wiring portion 160 that extends around the central portion 120, for example, extends so as to be curved or circle around the central portion 120". As is clear from the form illustrated in FIG. 1, the "central portion 120" occupies a relatively wide region in the unit wiring structure 110, and the "curved wiring portion 160" that occupies a relatively narrow region is provided so as to be located around the periphery of the "central portion 120". The unit wiring structure 110 may have a gap. Specifically, a gap may be provided in a region between a central portion and a curved wiring portion and/or a region between curved wiring portions. Note that the "curved wiring portion" as used herein refers to a strip that is provided outside a central portion so that one end thereof is connected to the central portion. Accordingly, the "curved wiring portion" may be a strip that is at least partially curved.

As illustrated in FIG. 1, the central portion 120 is made up of at least the electronic component 10, "a portion 20A of the first insulating layer 20", "a portion 30A of the first metal layer 30", and "a portion 40A of the second metal layer 40". Meanwhile, the curved wiring portion 160 is made up of at least "a portion 20B of the first insulating layer 20 that is different from the portion 20A", "a portion 30B of the first metal layer 30 that is different from the portion 30A", and "a portion 40B of the second metal layer 40 that is different from the portion 40A". In other words, in the unit wiring structure 110, the "central portion 120" that occupies a relatively wide region has the electronic component 10, whereas the "curved wiring portion 160" that occupies a relatively narrow region around the periphery of the "central portion 120" does not have the electronic component 10. In the unit wiring structure 110, the "portion 30A of the first metal layer 30" and the "portion 40A of the second metal layer 40" can function as wiring layers of the "central portion 120", whereas the "portion 30B of the first metal layer 30 that is different from the portion 30A" and the "portion 40B of the second metal layer 40 that is different from the portion 40A" can function as wiring layers of the "curved wiring portion 160". In the unit wiring structure 110, the "portion 20A of the first insulating layer 20" constitutes an insulating layer of the "central portion 120" and can function as a layer for holding or supporting the wiring layers in the central portion. Meanwhile, the "portion 20B of the first insulating layer 20 that is different from the portion 20A" constitutes an insulating layer of the "curved wiring portion 160" and can function as a layer for holding or supporting the wiring layers in the curved wiring portion.

The "portion 20A of the first insulating layer 20" and the "portion 20B of the first insulating layer 20" may constitute an integral single layer in the stretchable flexible substrate 100. That is, the "portion 20A of the first insulating layer 20" and the "portion 20B of the first insulating layer 20" may be continuous with each other. The "portion 20A of the first insulating layer 20" and the "portion 20B of the first insulating layer 20" are in a relationship such that the "portion 20A" is located inside the "portion 20B", i.e., the "portion 20B" is located outside the "portion 20A". Similarly, the "portion 30A of the first metal layer 30" and the "portion 30B of the first metal layer 30" may constitute an integral single layer, i.e., may be continuous with each other in the stretchable flexible substrate 100. The "portion 30A of the first metal layer 30" and "portion 30B of the first metal layer 30" are in a relationship such that the "portion 30A" is relatively located inside the "portion 30B", i.e., the "portion 30B" is relatively located outside the "portion 30A". The "portion 40A of the second metal layer 40" and the "portion 40B of the second metal layer 40" may constitute an integral single layer, i.e., may be continuous with each other in the stretchable flexible substrate 100. The "portion 40A of the second metal layer 40" and the "portion 40B of the second metal layer 40" are in a relationship such that the "portion 40A" is relatively located inside the "portion 40B", i.e., the "portion 40B" is located outside the "portion 40A".

As is clear from the form illustrated in FIG. 1, the electronic component 10 is located in a region that is an inside of the portion 20A of the first insulating layer 20 in the central portion 120 of the unit wiring structure 110. As illustrated in FIG. 1, the "portion 20A of the first insulating layer 20" and the "electronic component 10" may be disposed relative to each other so that the portion 20A of the first insulating layer 20 surrounds the electronic component 10. A side surface portion (peripheral portion) of the electronic component 10 and an inner side surface of the portion 20A of the first insulating layer 20 may be in contact with each other or may be in the vicinity of each other. Because of such a form, deviation of the position of the electronic component 10, for example, deviation of the position of electronic component 10 resulting from repetition of stretch and contraction is hard to occur in the central portion 120 of the unit wiring structure 110. It is therefore possible to provide a more suitable stretchable flexible substrate.

The stretchable flexible substrate 100 including the unit wiring structure 110 described above may be stretchable due to a change in curvature of the curved wiring portion 160. That is, in one aspect, the curvature of the curved wiring portion 160 of the unit wiring structure 110 changes when the stretchable flexible substrate 100 stretches or returns to an original shape thereof. More specifically, as a result of stretch of the stretchable flexible substrate 100, the curvature of the curved wiring portion 160 located outside the central portion 120 becomes smaller than that before the stretch.

With respect to the stacking configuration, the stretchable flexible substrate 100 is configured such that the electronic component 10, the first insulating layer 20, the first metal layer 30, the second metal layer 40, and the second insulating layer 50 are suitably disposed and stacked as described above. Such a configuration is a unique one that is not seen in a conventional substrate configuration, and is therefore described in detail.

In the stretchable flexible substrate 100 of the present disclosure, the first metal layer 30 and the second metal layer 40 are provided so as to be in contact with both surfaces of the first insulating layer 20 that is located around the electronic component 10, respectively, and the second insulating layer 50 is provided so as to seal the first insulating layer 20, the electronic component 10, and the second metal layer 40.

The electronic component 10 is not limited to a specific one, provided that the electronic component 10 is an electronic component used in an electronics packaging field. Examples of the electronic component 10 include a semiconductor element, a temperature sensor, a pressure sensor, and an actuator. The "semiconductor element" as used herein practically refers to a light-emitting element, a light-receiving element, a diode, a transistor, or the like. Other specific examples of the electronic component 10 include an IC (e.g., a control IC), an inductor, a capacitor, a power element, a chip resistor, a chip capacitor, a chip varistor, a chip thermistor, other chip-like laminate filters, and a connection terminal. Such an electronic component 10 is not limited to one kind. That is, at least two kinds of electronic components may be provided in the stretchable flexible substrate 100.

The first metal layer 30 and the second metal layer 40 may be made of a metal material that exhibits good electrical conductivity. The metal material of the first metal layer 30 and the second metal layer 40 may be, for example, at least one kind selected from the group consisting of gold (Au), silver (Ag), copper (Cu), nickel (Ni), chromium (Cr), cobalt (Co), magnesium (Mg), calcium (Ca), platinum (Pt), molybdenum (Mo), iron (Fe), and zinc (Zn). For example, the first metal layer 30 and the second metal layer 40 may be layers made of at least one kind of metal material selected from the group consisting of copper (Cu), nickel (Ni), aluminum (Al), and stainless steel. From the perspective of a good etching property, the first metal layer 30 and the second metal layer 40 may contain copper. The thickness of each of the first metal layer 30 and the second metal layer 40 is not limited to a specific one, provided that stretchability, flexibility, and the like are not inhibited in a particularly unfavorable manner. The thickness of each of the first metal layer 30 and the second metal layer 40 may be approximately 5 μm to 1000 μm, may be approximately 5 μm to 500 μm, or may be approximately 5 μm to 250 μm, for example, approximately 5 μm to 100 μm or approximately 10 μm to 50 μm although these values are merely examples.

In particular, the first metal layer 30 may be a layer made of a metal foil. That is, a metal foil may be provided, as the first metal layer 30, so as to be in contact with the first main surface of the first insulating layer 20. The thickness of the metal foil may be approximately 9 μm to 1000 μm, may be approximately 18 μm to 500 μm, or may be approximately 20 μm to 100 μm. The metal foil contains, for example, at least one kind of metal material selected from the group consisting of copper (Cu), nickel (Ni), and aluminum (Al). The metal foil may be a copper foil although this is merely an example.

Meanwhile, the second metal layer 40 may be a metal plating layer. In particular, the metal plating layer may have two-layer structure made up of a dry plating layer 41 and a wet plating layer 42 (see FIGS. 1 and 2). In this two-layer structure, the dry plating layer 41 is located on a relatively inner side, whereas the wet plating layer 42 is located on a relatively outer side (see FIG. 2). More specifically, the dry plating layer 41 may be provided so as to be directly in contact with the electronic component (especially an electrode thereof), and the wet plating layer 42 may be provided on the dry plating layer 41. As is clear from this, the expression "located on a relatively inner side" as used herein practically refers to being located closer to the electronic component (especially the electrode thereof), whereas the expression "located on a relatively outer side" as used herein practically refers to being located farther from the electronic component (especially the electrode thereof).

The dry plating layer 41 is a layer formed by a dry plating method such as a physical vapor deposition method (PVD method) or a chemical vapor deposition method (CVD method). Meanwhile, the wet plating layer 42 is a layer formed by a wet plating method such as an electroplating method (e.g., electrolytic plating), a chemical plating method, or a hot-dip plating method. The dry plating layer 41 is a very thin layer and has, for example, a thickness of approximately 100 nm to 3000 nm. Meanwhile, the wet plating layer 42 is a thick layer and has, for example, a thickness of approximately 18 μm to 500 μm. The dry plating layer 41 may contain, for example, at least one kind of metal material selected from the group consisting of Ti (titanium), Cr (chromium), and Ni (nickel). Meanwhile, the wet plating layer 42 may contain at least one kind of metal material selected from the group consisting of Cu (copper), Ni (nickel), and Al (aluminum).

Figure 2:
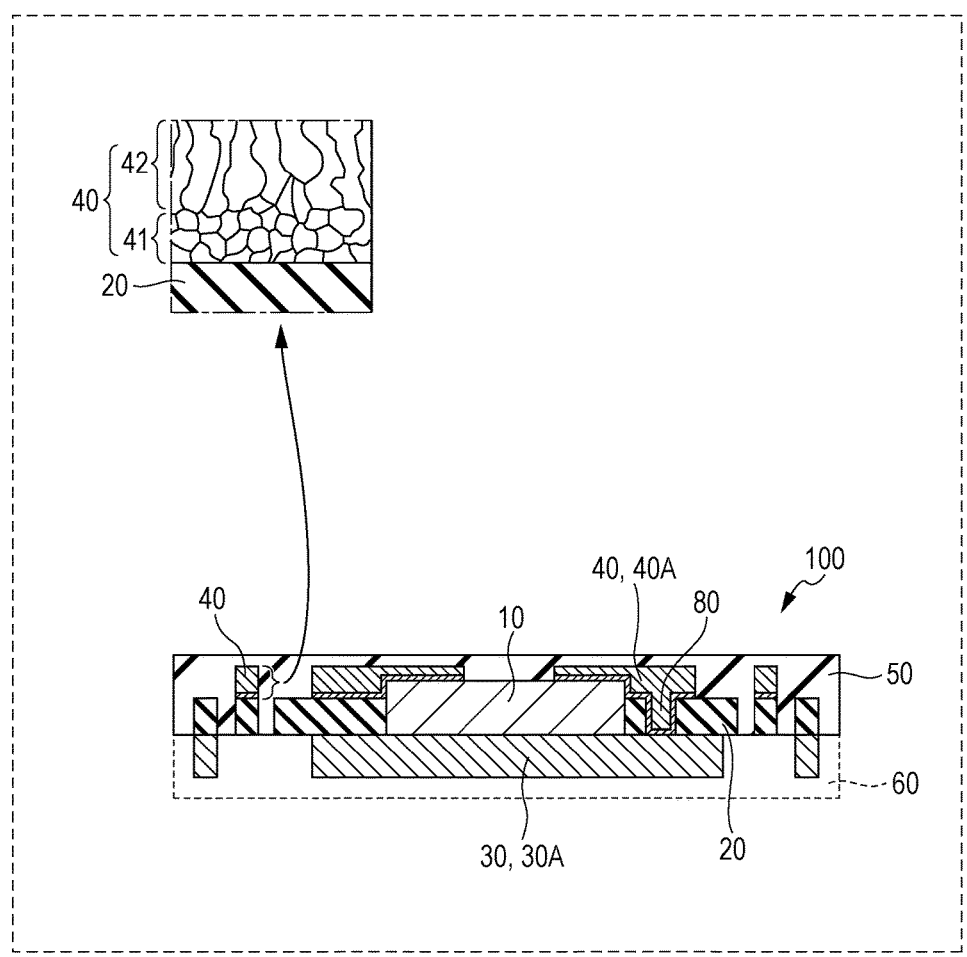
FIG. 2 is a cross-sectional view schematically illustrating a configuration of the stretchable flexible substrate according to the present disclosure.

As illustrated in FIG. 2, the dry plating layer 41 can correspond to a "layer having a relatively small average crystal grain size", whereas the wet plating layer 42 can correspond to a "layer having a relatively large average crystal grain size". As for specific crystal grain sizes of the dry plating layer 41 and the wet plating layer 42, the "average crystal grain size of the dry plating layer 41" is larger than 0 and not larger than 2 μm, whereas the "average crystal grain size of the wet plating layer 42" is 5 μm to 20 μm. Note that the "crystal grain size" as used herein refers to a crystal grain size value calculated on the basis of an "image of a cross section taken along a thickness direction of the metal plating layer". For example, the "crystal grain size" refers to a diameter size of a circle whose area is identical to the area of a crystal grain obtained from such an image of the cross section, and the "average crystal grain size" refers to a number average of such crystal grain sizes (e.g., a number average of 50 crystal grain sizes).

The dry plating layer 41 is not limited to a single layer, and may be formed as a plurality of layers although this is merely an example. For example, a Ti thin film layer and a Cu thin film layer formed by sputtering may be provided as the dry plating layer 41. More specifically, a Cu thin film layer may be provided on a Ti thin film layer that is provided so as to be in contact with the electronic component 10 (especially the electrode thereof). In such a case, a thick Cu plating layer may be provided as the wet plating layer 42 on this sputtering layer having a two-layer structure.

In the stretchable flexible substrate 100 according to the present disclosure, the first insulating layer 20 and the second insulating layer 50 may be resin layers. In such a case, the second insulating layer 50 may be made of a softer resin material than the first insulating layer 20. This is because the first insulating layer 20 can function as a layer for holding the wiring layers (the first metal layer 30 and the second metal layer 40) and is therefore required to be made of a "material that is hard" to some extent, whereas the second insulating layer 50 is required to be made of a "material that is soft" to an extent such that stretchability of the substrate is not inhibited in an unfavorable manner. That is, the second insulating layer 50, which is provided so as to seal the electronic component 10, the first insulating layer 20, and the second metal layer 40, can function to constrain these constituent elements in an integrated manner, but may have a flexible property to an extent such that a change in curvature of the curved wiring portion 160 is not inhibited in an unfavorable manner. This allows the stretchable flexible substrate 100 to exhibit stretchability while holding the constituent elements of the stretchable flexible substrate 100 in an integrated manner. In such a case, the second insulating layer 50 may be also referred to as a "stretchable resin layer".

Specific resin materials of the first insulating layer 20 and the second insulating layer 50 are not limited in particular, provided that the second insulating layer 50 is softer than the first insulating layer 20. For example, the first insulating layer 20 may contain at least one kind of resin material selected from the group consisting of an acrylic resin, an urethane resin, a silicone resin, a fluorine resin, a polyimide resin, and an epoxy resin, whereas the second insulating layer 50 may contain an elastomer material. The resin material of the second insulating layer 50 may be an elastomer material having flexibility. Specific examples of the elastomer material used for the second insulating layer 50 include silicone rubber, acrylic rubber, fluororubber, and urethane rubber, and also include thermoplastic elastomers such as a styrene elastomer, an olefinic elastomer, a vinyl chloride elastomer, an urethane elastomer, and an amide elastomer.

Figure 3:
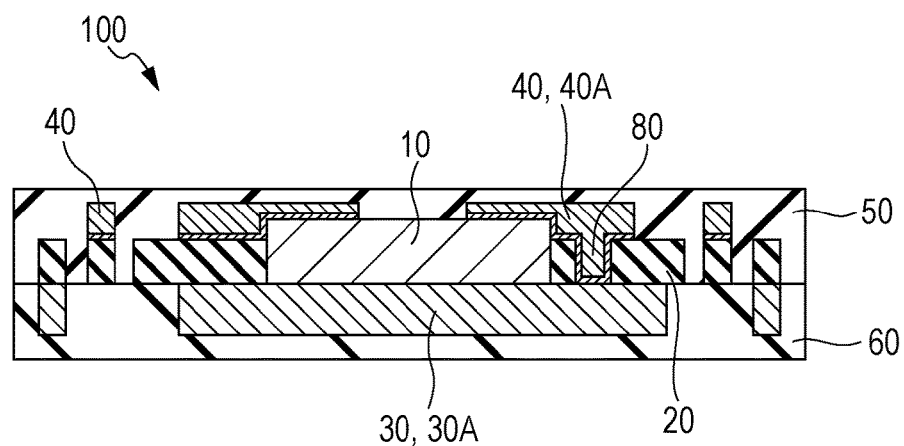
FIG. 3 is a cross-sectional view schematically illustrating a configuration of the stretchable flexible substrate according to the present disclosure.

The stretchable flexible substrate 100 according to the present disclosure may further include another insulating layer. That is, a third insulating layer 60 may be provided in addition to the first insulating layer 20 and the second insulating layer 50. Specifically, as illustrated in FIGS. 1 through 3, the stretchable flexible substrate 100 may be a substrate that further has the third insulating layer 60 that is provided so as to seal the first metal layer 30. In such a case, as illustrated in FIGS. 1 through 3 (especially FIG. 3), the second insulating layer 50 may be stacked on the third insulating layer 60.

In a case where the third insulating layer 60 is provided, the electronic component 10, the first insulating layer 20, the first metal layer 30, and the second metal layer 40 are provided so as to be embedded in an insulating layer laminate made up of the second insulating layer 50 and the third insulating layer 60.

As illustrated in FIG. 3, the first metal layer 30 may be located so as to be flush with a boundary face between the second insulating layer 50 and the third insulating layer 60. More specifically, "an upper surface of the first metal layer 30, i.e., a surface that is in contact with the first main surface of the first insulating layer 20" and "a boundary face between the second insulating layer 50 and the third insulating layer 60" may be located on the same plane. This allows the first metal layer 30 to be suitably contained in an inside of the second insulating layer 50 and the third insulating layer 60 that are in contact with each other, thereby achieving a suitable sealing property as a whole substrate.

Similarly, as illustrated in FIG. 3, the first insulating layer 20 may be located so as to be flush with the boundary face between the second insulating layer 50 and the third insulating layer 60. More specifically, "a lower surface of the first insulating layer 20, i.e., the first main surface of the first insulating layer 20" and "the boundary face between the second insulating layer 50 and the third insulating layer 60" may be located on the same plane. This allows the first insulating layer 20 to be suitably contained in an inside of the second insulating layer 50 and the third insulating layer 60 that are in contact with each other, thereby achieving a suitable sealing property as a whole substrate.

In the stretchable flexible substrate 100 according to the present disclosure, the first insulating layer 20 and the third insulating layer 60 may be resin layers. In such a case, the third insulating layer 60 may be made of a softer resin material than the first insulating layer 20. This is because the first insulating layer 20, which can function as a layer for holding the wiring layers (the first metal layer 30 and the second metal layer 40), is required to be made of a "material that is hard" to some extent as described above, whereas the third insulating layer 60 is required to be made of a "material that is soft" to an extent such that stretchability of the substrate is not inhibited in an unfavorable manner. That is, the third insulating layer 60, which is provided so as to seal the first metal layer 30, functions to constrain the first metal layer 30, but may have a flexible property to an extent such that a change in curvature of the curved wiring portion 160 is not inhibited in an unfavorable manner. This allows the stretchable flexible substrate 100 to exhibit stretchability while holding the constituent elements of the stretchable flexible substrate 100 in an integrated manner. In such a case, the third insulating layer 60 may be referred to as a "stretchable resin layer" as in the case of the second insulating layer 50.

Specific resin materials of the first insulating layer 20 and the third insulating layer 60 are not limited in particular, provided that the third insulating layer 60 is softer than the first insulating layer 20. For example, the first insulating layer 20 may contain at least one kind of resin material selected from the group consisting of an acrylic resin, an urethane resin, a silicone resin, a fluorine resin, a polyimide resin, and an epoxy resin, whereas the third insulating layer 60 may contain an elastomer material. The resin material of the third insulating layer 60 may be an elastomer material having flexibility. Specific examples of the elastomer material used for the third insulating layer 60 include silicone rubber, acrylic rubber, fluororubber, and urethane rubber, and also include thermoplastic elastomers such as a styrene elastomer, an olefinic elastomer, a vinyl chloride elastomer, an urethane elastomer, and an amide elastomer.

In a case where not only the third insulating layer 60, but also the second insulating layer 50 are made of softer resin materials than the first insulating layer 20, the second insulating layer 50 and the third insulating layer 60 exhibit a more suitable flexible property as a whole. This allows the stretchable flexible substrate 100 to more suitably exhibit stretchability while holding the constituent elements of the stretchable flexible substrate 100 in an integrated manner. In other words, the electronic component 10, the first insulating layer 20, the first metal layer 30, and the second metal layer 40 are provided so as to be embedded in a stretchable resin layer (i.e., "a stretchable resin layer made up of the second insulating layer 50 and the third insulating layer 60").

Figure 4:
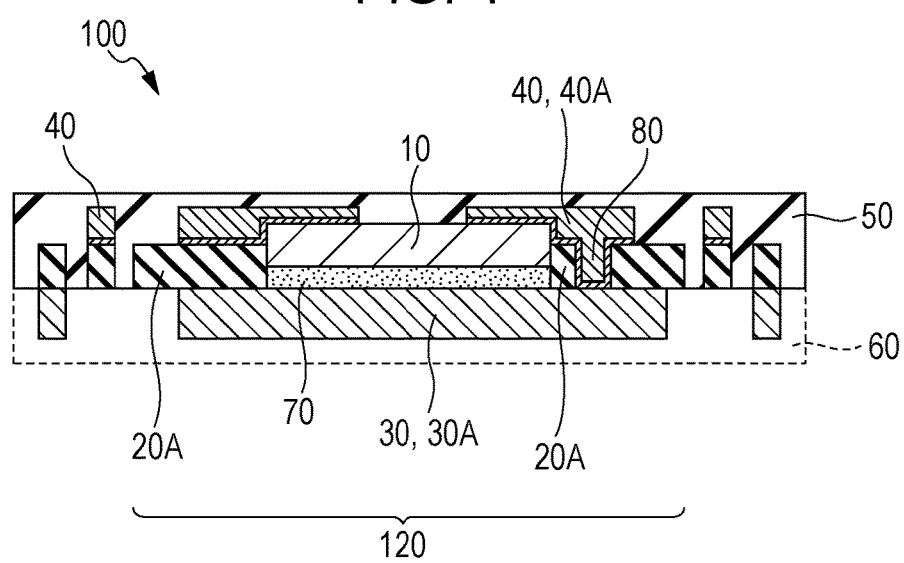
FIG. 4 is a cross-sectional view schematically illustrating a configuration of the stretchable flexible substrate according to the present disclosure.

The stretchable flexible substrate 100 according to the present disclosure may include an adhesive layer. Specifically, as illustrated in FIG. 4, the stretchable flexible substrate 100 may further include an adhesive layer 70 that is provided so as to be in contact with the electronic component 10. As is clear from the aspect illustrated in FIG. 4, the electronic component 10 may be stacked on the adhesive layer 70. In particular, the electronic component 10 is located in a region that is an inside of the portion 20A of the first insulating layer 20 in the central portion 120 of the unit wiring structure, and the electronic component 10 may be stacked on the adhesive layer 70 in this region that is an inside of the portion 20A of the first insulating layer 20. The adhesive layer 70 may be located so as to be flush with the boundary face between the second insulating layer 50 and the third insulating layer 60. More specifically, "a lower surface of the adhesive layer 70 (i.e., a main surface opposite to a surface adhered to the electronic component)" and "the boundary face between the second insulating layer 50 and the third insulating layer 60" may be located on the same plane.

As illustrated in FIG. 4, the aspect in which the adhesive layer 70 is provided can correspond, for example, to an aspect in which the adhesive layer 70 is provided so as to be interposed between the electronic component 10 and the first metal layer 30 (a case of "First Embodiment" that will be described later). The aspect in which the adhesive layer 70 is provided can also correspond to an aspect in which the adhesive layer 70 is provided so as to be interposed between the electronic component 10 and the third insulating layer 60 (a case of "Second Embodiment" that will be described later).

The adhesive layer 70 may contain at least one adhesive material selected from the group consisting of an acrylic resin adhesive, an urethane resin adhesive, a silicone resin adhesive, a fluorine resin adhesive, a polyimide resin adhesive, and an epoxy resin adhesive.

Due to the presence of such an adhesive layer 70, deviation of the position of the electronic component 10 (especially deviation of the position arising from repetition of stretch and contraction) and the like is less likely to occur in the central portion 120 of the unit wiring structure, thereby making it possible to provide a more suitable stretchable flexible substrate.

The stretchable flexible substrate 100 according to the present disclosure may include an interlayer connection portion. Specifically, as illustrated in FIGS. 1 through 4, an interlayer connection portion 80 that connects the first metal layer 30 and the second metal layer 40 may be provided. The interlayer connection portion 80 extends so as to penetrate the first insulating layer 20 and electrically connects the first metal layer 30 and the second metal layer 40. In the aspect illustrated in FIGS. 1 through 4, the interlayer connection portion 80 that connects the portion 30A of the first metal layer 30 and the portion 40A of the second metal layer 40 is provided in the central portion 120 of the unit wiring structure. Such an interlayer connection portion 80 offers freedom to the configuration and form of the substrate wiring, thereby allowing more suitable wiring design according to a substrate application.

As is clear from the aspect illustrated in FIGS. 1 through 4, the interlayer connection portion 80 may be practically constituted by the second metal layer 40. That is, a portion of the second metal layer 40 may penetrate the first insulating layer 20 and locally extend so as to be in contact with the first metal layer 30. This means that a special process for formation of the interlayer connection portion 80 is unnecessary, and the interlayer connection portion 80 can be obtained as a result of formation of the second metal layer 40. Furthermore, in a case where the interlayer connection portion 80 is practically constituted by the second metal layer 40, the interlayer connection portion 80 and the second metal layer 40 are made of the same material. This improves reliability in connection.

A stretchable flexible substrate according to the present disclosure can be realized in various aspects. These aspects are described below.

First Embodiment

Figure 5:
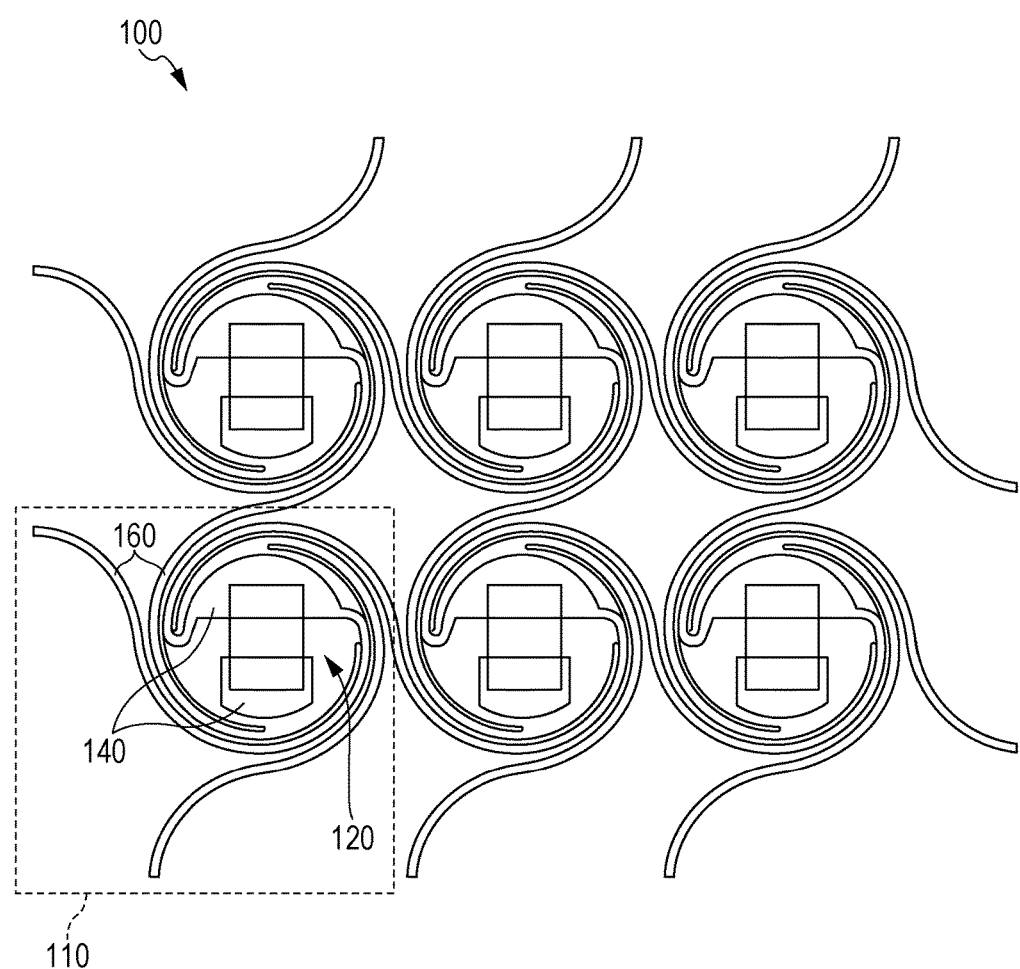
FIG. 5 is a plan view schematically illustrating a configuration of a stretchable flexible substrate according to one aspect of the present disclosure.

A stretchable flexible substrate 100 according to First Embodiment of the present disclosure includes a plurality of unit wiring structures 110 disposed in a matrix as illustrated in FIG. 5. As illustrated in FIG. 5, each of the unit wiring structures 110 includes four curved wiring portions 160 disposed around a central portion 120 having a circular shape. The curved wiring portions 160 are disposed symmetrically about the center of the central portion 120. The four curved wiring portions 160 may be disposed at equal intervals around the central portion 120. In a case where the four curved wiring portions 160 are disposed at equal intervals around the central portion 120, there may be two lines each connecting ends of two curved wiring portions 160 that face each other and corresponding to the diameter of the central portion 120, and the two lines may be orthogonal to each other. Accordingly, in a case where a plurality of unit wiring structures 110 are provided, the unit wiring structures 110 can be aligned in both one direction and another direction that is orthogonal to the one direction. That is, in the stretchable flexible substrate according to the present disclosure, the unit wiring structures 110 that are adjacent to each other can be disposed in a matrix in vertical and horizontal directions.

The stretchable flexible substrate 100 that is made up of the plurality of unit wiring structures 110 disposed in a matrix is stretchable not only in one direction, but also in another direction orthogonal to the one direction. Accordingly, the stretchable flexible substrate 100 according to First Embodiment of the present disclosure can exhibit stretchability that is different from a conventional substrate that is stretchable in a direction in which the substrate extends, but is hard to stretch in a direction different from the direction in which the substrate extends.

The stretchable flexible substrate 100 according to First Embodiment of the present disclosure can fit even an object having a complicated shape such as a human finger. Specifically, the stretchable flexible substrate 100 according to First Embodiment of the present disclosure is also applicable to sensing in close contact with a human body and a wearable apparatus that is required to be attached to a joint and a movable part other than a wrist without discomfort.

Figure 6:
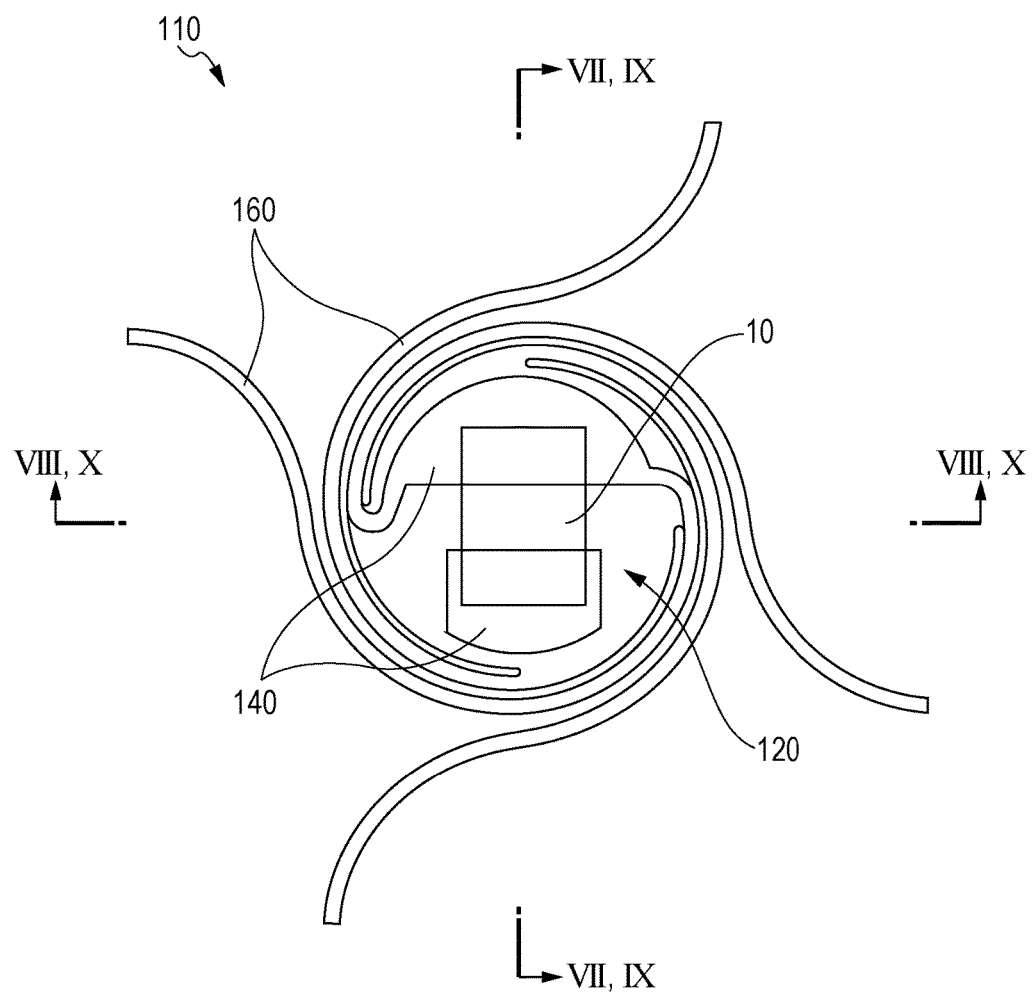
FIG. 6 is a plan view illustrating a unit wiring structure of the stretchable flexible substrate according to the present disclosure.
Figure 7:
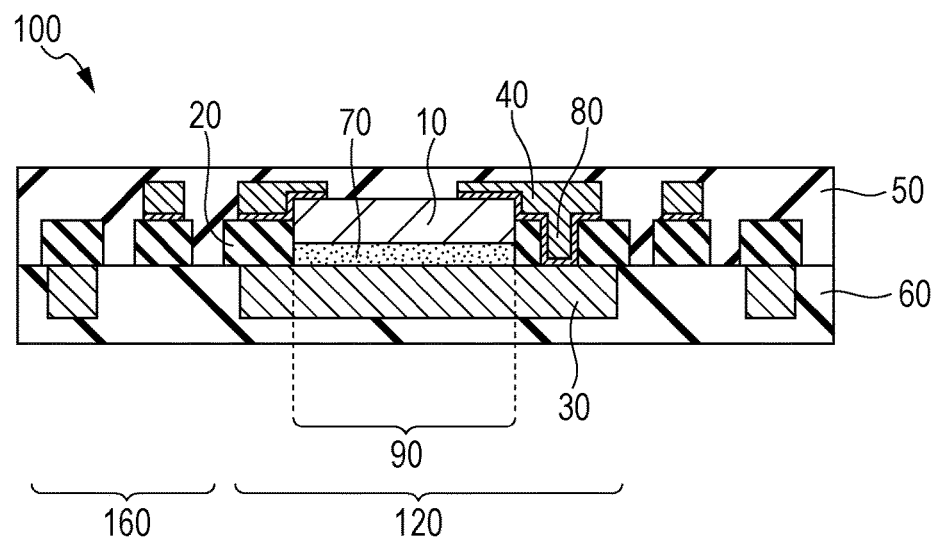
FIG. 7 is a cross-sectional view taken along one direction illustrating the unit wiring structure of the stretchable flexible substrate illustrated in FIG. 6.
Figure 8:
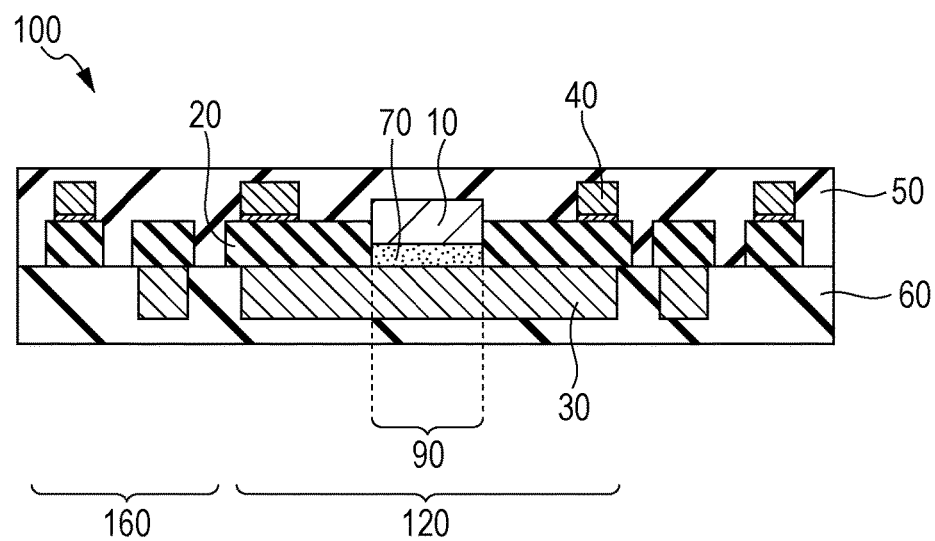
FIG. 8 is a cross-sectional view taken along another direction illustrating the unit wiring structure of the stretchable flexible substrate illustrated in FIG. 6.

FIGS. 7 and 8 are cross-sectional views illustrating a unit wiring structure 110 (FIG. 6) of the stretchable flexible substrate 100 according to First Embodiment of the present disclosure. FIG. 7 is a cross-sectional view taken along the line VII-VII in FIG. 6, and FIG. 8 is a cross-sectional view taken along the line VIII-VIII in FIG. 6.

As illustrated in FIGS. 7 and 8, in the central portion 120 of the unit wiring structure 110, a recess 90 is formed above a metal foil that is a first metal layer 30 due to the presence of a first insulating layer 20. The recess 90 corresponds to "a region that is an inside of a portion of the first insulating layer 20". An electronic component 10 is provided in the recess 90 with an adhesive layer 70 interposed between the electronic component 10 and the metal foil. The electronic component 10 is electrically connected to a metal plating layer that is a second metal layer 40, and this metal plating layer constitutes an electrode pattern 140 illustrated in FIGS.

5 and 6. The metal plating layer is electrically connected to the metal foil via an interlayer connection portion 80.

The curved wiring portion 160 of the unit wiring structure 110 is connected to an adjacent unit wiring structure 110 via the metal plating layer and the metal foil that are provided on upper and lower surfaces of the first insulating layer 20, respectively. In the aspect illustrated in FIGS. 7 and 8, a resin layer laminate constituted by a second insulating layer 50 and a third insulating layer 60 is made of a soft material and is provided so as to seal the electronic component 10, the first insulating layer 20, the metal foil, the metal plating layer, and the adhesive layer 70. The resin layer laminate improves reliability of the electronic component 10, and functions as a restraint layer for restraining stretch of the curved wiring portion 160 to some extent, thereby preventing breaking of wires, and the like.

Note that the resin layer laminate is not limited to the one that seals all of the electronic component 10, the first insulating layer 20, the metal foil, the metal plating layer, and the adhesive layer 70, and can be one that seals at least one of these constituent elements. Furthermore, it is possible to employ an arrangement in which only one of the second insulating layer 50 and the third insulating layer 60 that constitute the resin layer laminate is provided.

The property of the adhesive layer 70 can be selected depending on the electronic component 10 to be disposed. For example, in a case where the electronic component 10 is one that has an extraction electrode on upper and lower surfaces thereof, the adhesive layer 70 may be a layer made of an electrically-conductive adhesive. The electrically-conductive adhesive may be, for example, one that contains metal particles and thus has electrical conductivity. In this case, extraction from the "upper surface" is performed by the metal plating layer, and extraction from the "lower layer" is performed by the metal foil via the "adhesive layer 70 having electrical conductivity". In a case where the electronic component 10 is one that requires heat release, the adhesive layer 70 may be made of an adhesive that contains particles such as alumina and that is good in heat release. In this way, the adhesive layer 70 can be given various functions.

In the stretchable flexible substrate 100 according to the present embodiment, the electronic component 10 is firmly fixed by the adhesive layer 70 in the recess 90. In the unit wiring structure 110 including the plurality of curved wiring portions 160 disposed around the central portion 120 having a substantially circular shape, the first metal layer 30 and the second metal layer 40 that serve as wires are provided so as to be integral with the first insulating layer 20. This allows the stretchable flexible substrate 100 to exhibit stretchability while suppressing concentration of stress and occurrence of breaking of the wires.

Second Embodiment

Figure 9:
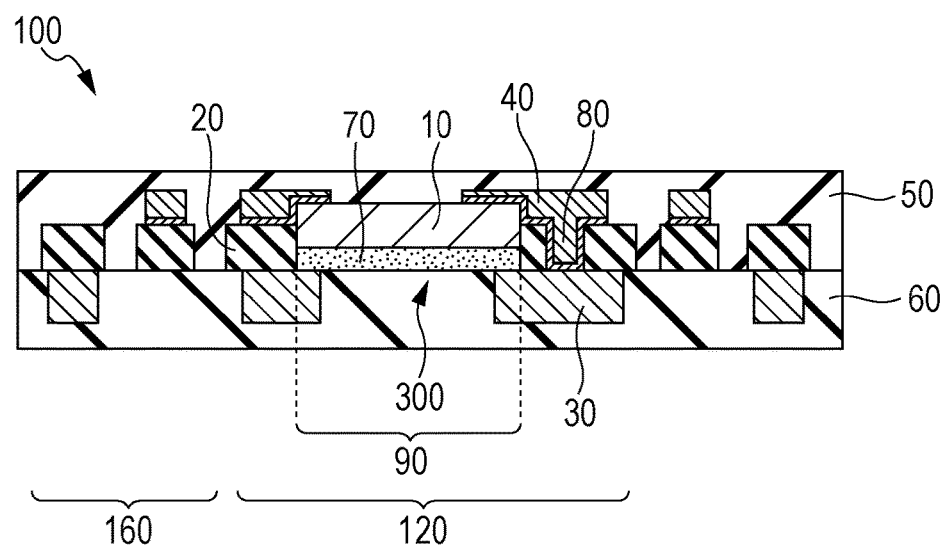
FIG. 9 is a cross-sectional view taken along one direction illustrating the unit wiring structure of the stretchable flexible substrate illustrated in FIG. 6.
Figure 10:
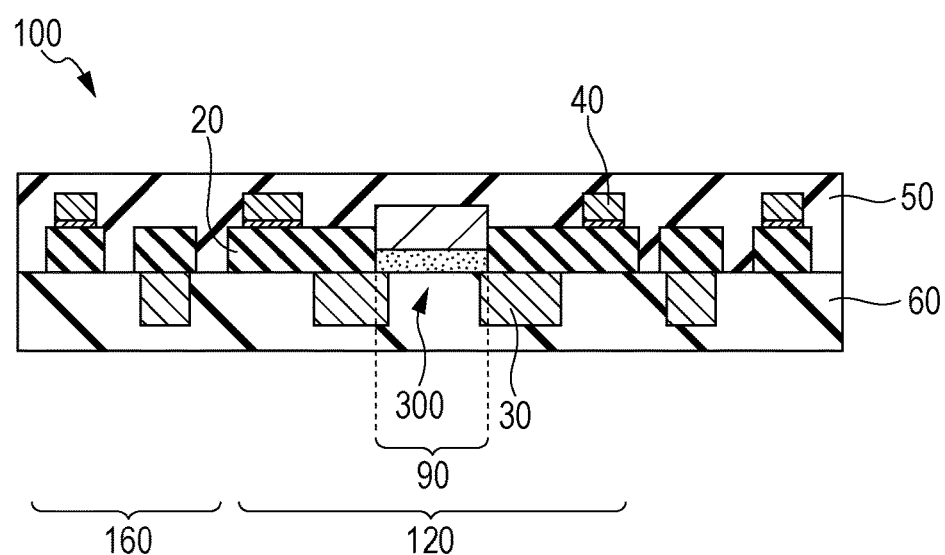
FIG. 10 is a cross-sectional view taken along another direction illustrating the unit wiring structure of the stretchable flexible substrate illustrated in FIG. 6.

A stretchable flexible substrate 100 according to Second Embodiment of the present disclosure is illustrated in FIGS. 9 and 10. FIG. 9 is a cross-sectional view taken along the line IX-IX in FIG. 6, and FIG. 10 is a cross-sectional view taken along the line X-X in FIG. 6.

Second Embodiment is suitable in a case where an electronic component 10 is, for example, an LED. Second Embodiment is suitable especially in a case where the electronic component 10 is an "LED whose upper and lower surfaces are light-emitting surface and an extraction electrode surface" and in a case where the electronic component 10 is an "LED whose upper and lower surfaces are light-emitting surfaces".

As illustrated in FIGS. 9 and 10, in a central portion 120 of a unit wiring structure 110, a recess 90 is formed above a metal foil that is a first metal layer 30 by a first insulating layer 20. The recess 90 corresponds to a "region that is an inside of a portion of the first insulating layer 20". The electronic component 10 is provided in the recess 90 with an adhesive layer 70 interposed between the electronic component 10 and the metal foil. The electronic component 10 is electrically connected to a metal plating layer that is a second metal layer 40, and this metal plating layer constitutes an electrode pattern 140 illustrated in FIGS. 5 and 6. The metal plating layer is electrically connected to the metal foil via an interlayer connection portion 80. A curved wiring portion 160 of the unit wiring structure 110 is connected to an adjacent unit wiring structure 110 via the metal plating layer and the metal foil that are provided on upper and lower surfaces of the first insulating layer 20, respectively. In the aspect illustrated in FIGS. 9 and 10, a resin layer laminate that is constituted by a second insulating layer 50 and a third insulating layer 60 is made of a soft material and is provided so as to seal the electronic component 10, the first insulating layer 20, the metal foil, the metal plating layer, and the adhesive layer 70. The resin layer laminate improves reliability of the electronic component 10, and functions as a restraint layer that restrains stretch of the curved wiring portion 160 to some extent, thereby preventing breaking of wires, and the like.

In Second Embodiment, the first metal layer 30 is locally removed so that a region 300 directly below the electronic component 10 is formed, thereby allowing light emitted from the lower surface of the electronic component 10 to be extracted. In such a case, the adhesive layer 70 may be made of a material that has a good optical property. That is, the adhesive layer 70 may have light transmittance. This makes it possible to more suitably extract the light emitted from the lower surface of the electronic component 10. In Second Embodiment, the first metal layer 30 may be provided as a reflection plate.

In First Embodiment and Second Embodiment described above, the stretchable flexible substrate 100 includes the unit wiring structures 110 disposed in a matrix. In other words, the plurality of unit wiring structures 110 are disposed in a certain direction or disposed in both a certain direction and a direction that crosses the certain direction. As is clear from the form illustrated in FIG. 6, a curved wiring portion that connects unit wiring structures may be curved so as to have an inflection point.

Figure 11A:
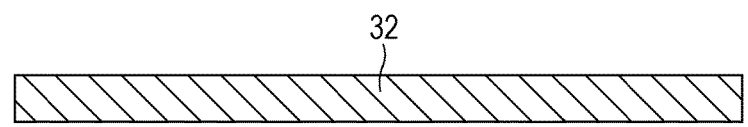
FIG. 11A is a step cross-sectional view schematically illustrating a method for producing the stretchable flexible substrate according to one aspect of the present disclosure.
Figure 11B:
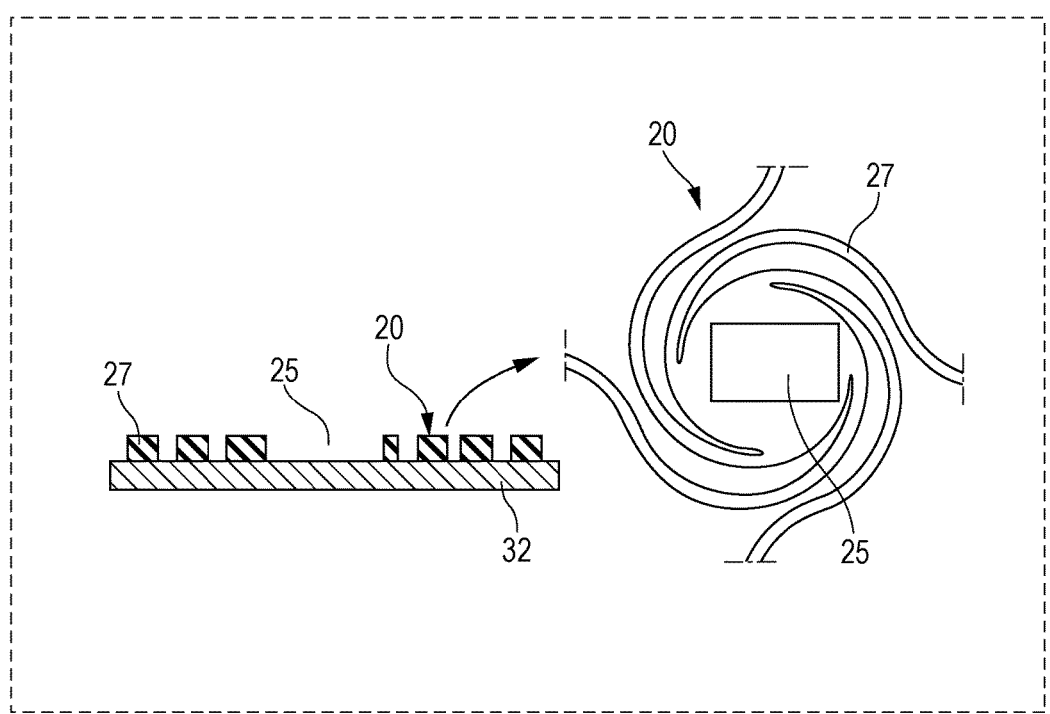
FIG. 11B is a step cross-sectional view schematically illustrating a method for producing the stretchable flexible substrate according to the aspect of the present disclosure.
Figure 11C:
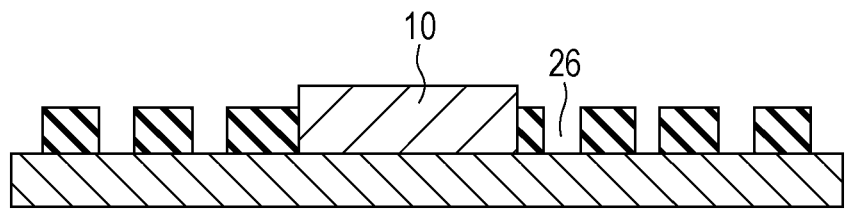
FIG. 11C is a step cross-sectional view schematically illustrating a method for producing the stretchable flexible substrate according to the aspect of the present disclosure.

Method for Producing Stretchable Flexible Substrate According to Present Disclosure Next, a method for producing a stretchable flexible substrate according to one aspect of the present disclosure is described. FIGS. 11A through 11H schematically illustrate processes related to the production method according to the present disclosure. In the production method according to the present disclosure, first, a step (i) is performed. Specifically, the first insulating layer 20 is mounted on a precursor member 32 of a first metal layer as illustrated in FIGS. 11A and 11B. More specifically, the "first insulating layer 20 that has a hollow region 25 in which an electronic component is to be disposed and a curved portion 27 that extends so as to be curved about the hollow region 25" is mounted on the precursor member 32 of the first metal layer.

A metal foil may be used as the precursor member 32 of the first metal layer in the step (i). The thickness of the metal foil may be approximately 9 μm to 1000 μm, may be approximately 18 μm to 500 μm, or may be approximately 20 μm to 100 μm. The metal foil contains, for example, at least one kind of metal material selected from the group consisting of copper (Cu), nickel (Ni), and aluminum (Al). A copper foil may be used as the metal foil although this is merely an example.

A "member made up of a plurality of layers" may be used as the precursor member 32 of the metal layer. For example, a metal foil that has a support member that can be peeled off afterward or can be removed by etching afterward may be used. Alternatively, a metal foil that has an etching stop layer on a surface thereof, or the like may be used.

The first insulating layer 20 mounted on the precursor member 32 may be a resin layer. In such a case, a "resin layer that has the hollow region 25 in which the electronic component is to be disposed and the curved portion 27 that extends so as to be curved about the hollow region 25" is mounted on the precursor member 32 of the metal layer. A printing method such as screen printing, offset printing, gravure printing, gravure offset printing, inkjet printing, inversion printing, or flexographic printing may be used as a method for forming the resin layer in a case where the resin layer is made of a liquid material. A resin material having photosensitivity may be used as a material of the resin layer. In this case, "a pattern that has the hollow region 25 in which the electronic component is to be disposed and the curved portion 27 that extends so as to be curved about the hollow region 25" can be more suitably formed as the resin layer through an etching process or the like. Specifically, a desired resin layer can be obtained by forming a layer made of a photosensitive resin material on an entire surface of the precursor member 32 and then patterning the layer by etching. The patterning process itself is not limited to a specific one, provided that the patterning process is one used in the electronics packaging field. For example, a desired patterning process may be performed by using photolithography in which resin layer formation, exposure, development, etching, and the like are performed.

A step (ii) is performed next to the step (i). Specifically, as illustrated in FIG. 11 C, the electronic component 10 is disposed in the "hollow region 25". That is, the electronic component 10 is disposed in a region of a "recess" formed above the precursor member 32 by the first insulating layer 20. Examples of the disposed electronic component 10 include a semiconductor element (examples thereof include a light-emitting element, a light-receiving element, a diode, a transistor, and the like), a temperature sensor, a pressure sensor, an actuator, an IC (e.g., a control IC), an inductor, a capacitor, a power element, a chip resistor, a chip capacitor, a chip varistor, a chip thermistor, other chip-like laminate filters, and a connection terminal.

Figure 11D:
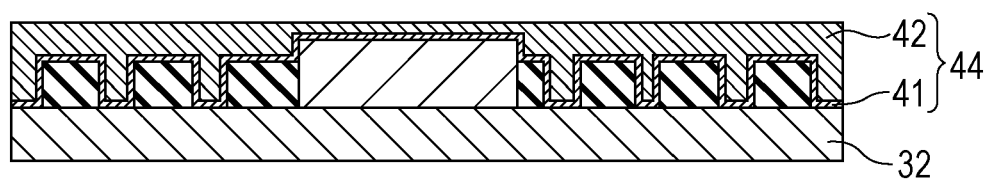
FIG. 11D is a step cross-sectional view schematically illustrating a method for producing the stretchable flexible substrate according to the aspect of the present disclosure.
Figure 11E:
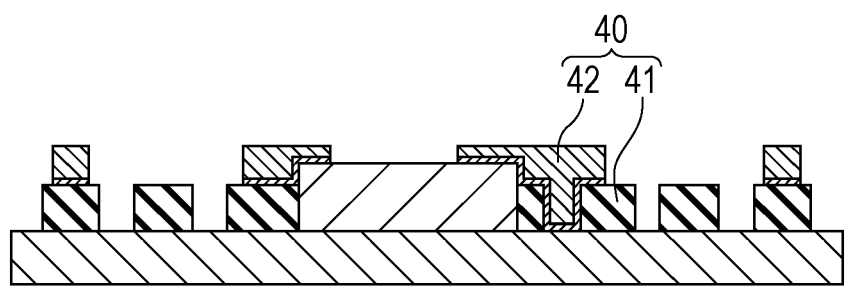
FIG. 11E is a step cross-sectional view schematically illustrating a method for producing the stretchable flexible substrate according to the aspect of the present disclosure.

A step (iii) is performed next to the step (ii). Specifically, as illustrated in FIGS. 11D and 11E, a plating process is performed, and the second metal layer 40 is formed by patterning the metal plating layer 44 formed by the plating process. In the plating process, the metal plating layer 44 is formed all over the precursor member 32, the electronic component 10, and the resin layer 20. As is clear from the aspect illustrated in FIGS. 11A through 11H, in the step (iii), the second metal layer 40 may be formed so as to fill a gap 26 of the first insulating layer 20 that is formed due to the curved portion 27, and thereby "an interlayer connection portion that connects the first metal layer 30 and the second metal layer 40" may be finally formed in the gap 26.

In the plating process in the step (iii), a wet plating method may be performed after a dry plating method. That is, a wet plating layer 42 may be formed by performing a wet plating method after a dry plating layer 41 is formed by performing a dry plating method. This makes it possible to form the metal plating layer 44 having a two-layer structure constituted by the dry plating layer 41 and the wet plating layer 42, and then the second metal layer 40 having the two-layer structure can be formed by patterning the metal plating layer 44.

A physical vapor deposition method (PVD method) or a chemical vapor deposition method (CVD method) may be performed as the dry plating method. Examples of the PVD method include sputtering, vacuum vapor deposition, and ion plating. Meanwhile, an electroplating method (e.g., electrolytic plating), a chemical plating method, a hot-dip plating, or the like may be performed as the wet plating method. In one aspect, in the production method according to the present disclosure, sputtering may be performed as the dry plating method, and an electroplating method (e.g., electrolytic plating) may be performed as the wet plating method.

Note that "the dry plating layer 41 that has a relatively small average crystal grain size" and "the wet plating layer 42 that has a relatively large average crystal grain size" can be formed by performing the wet plating method after performing the dry plating method. That is, since "a foundation layer that has a relatively small average crystal grain size" can be formed by the dry plating method, and then "a thick layer that has a relatively large average crystal grain size" can be formed by the wet plating method, the metal plating layer 44 having a two-layer structure constituted by the two layers having different average crystal grain sizes can be formed. Such a production method using the dry plating method and the wet plating method has a process characteristic that "the metal layer is directly formed on the precursor member 32, the electronic component 10, and the resin layer". This is because "the dry plating layer 41 that is a foundation layer for the thick wet plating layer 42" can be made very thin, and it can therefore be considered that the thick wet plating layer 42 is in direct plane contact with the precursor member 32, the electronic component 10, and the resin layer. The metal plating layer 44 can be made thick because of the thick wet plating layer 42, and therefore the metal plating layer 44 can be formed so as to fill "the gap 26 of the first insulating layer 20 formed due to the curved portion 27". Especially from the perspective of a production process, since the dry plating method is performed, a plating layer can be formed thick while achieving a good degree of contact by the wet plating method that is performed later.

The dry plating layer 41 having a thickness of 100 nm to 3000 nm may be formed by performing the dry plating method, and then the wet plating layer 42 having a thickness of 18 μm to 500 μm may be formed by performing the wet plating method (see FIG. 11D). The dry plating layer 41 formed by the dry plating method may contain, for example, at least one kind of metal material selected from the group consisting of Ti (titanium), Cr (chromium), and Ni (nickel). Meanwhile, the wet plating layer 42 formed by the wet plating method may contain at least one kind of metal material selected from the group consisting of Cu (copper), Ni (nickel), and Al (aluminum). Note that the dry plating layer 41 is not limited to a single layer and can be formed as a plurality of layers although this is merely an example. For example, a Ti thin-film layer and a Cu thin-film layer may be formed as the dry plating layer 41 by sputtering. More specifically, the Cu thin-film layer may be formed after the Ti thin-film layer is formed. In this case, a thick Cu plating layer may be formed as the wet plating layer 42 on this sputtering layer having a two layer structure by electrolytic plating.

The metal plating layer 44 is subjected to a patterning process, and thereby the second metal layer 40 is finally obtained from the metal plating layer 44 (see FIG. 11E). The patterning process itself is not limited to a specific one, provided that the patterning process is one used in the electronics packaging field. For example, a desired patterning process may be performed by using photolithography in which resist formation, exposure, development, etching, and the like are performed.

Figure 11F:
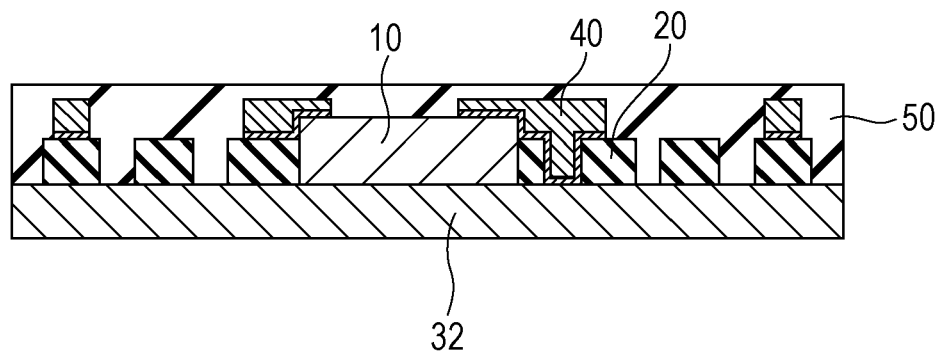
FIG. 11F is a step cross-sectional view schematically illustrating a method for producing the stretchable flexible substrate according to the aspect of the present disclosure.
Figure 11G:
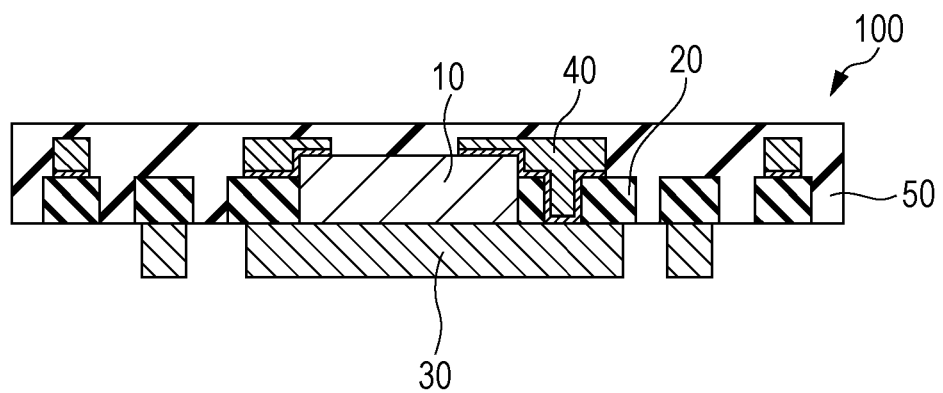
FIG. 11G is a step cross-sectional view schematically illustrating a method for producing the stretchable flexible substrate according to the aspect of the present disclosure.

A step (iv) is performed next to the step (iii). Specifically, as illustrated in FIG. 11F, the second insulating layer 50 is formed on the precursor member 32 so as to seal the electronic component 10, the first insulating layer 20, and the second metal layer 40. A resin layer may be formed as the second insulating layer 50. That is, a patterned surface side of the metal plating layer 44 may be coated with a sealing resin layer.

Formation of such a second insulating layer 50 is advantageous in that it is possible to prevent the curved wiring portion of the unit wiring structure from having a "hollow structure" in a later step.

In the production method according to the present disclosure, the first insulating layer 20 and the second insulating layer 50 may be formed as resin layers, and the second insulating layer 50 may be made of a softer resin material than the first insulating layer 20. That is, in a case where the first insulating layer 20 is formed as a resin layer containing at least one kind of resin material selected from the group consisting of an acrylic resin, an urethane resin, a silicone resin, a fluorine resin, a polyimide resin, and an epoxy resin, the second insulating layer 50 may be formed as a resin layer containing an elastomer material.

That is, a sealing resin material used for the sealing resin layer may be a material having flexibility such as elastomer. For example, in a case where the sealing resin layer is made of a liquid sealing resin material, the sealing resin layer may be formed through application. Examples of a specific method of application include, but are not limited to, a spin coat method, a roll coat method, a curtain coat method, a spray method, and a liquid droplet ejection method. The sealing resin layer may be formed by forming a sealing resin material prepared in advance as a sheet on the precursor member 32 by thermocompression bonding.

A step (v) is performed next to the step (iv). Specifically, as illustrated FIGS. 11F and 11G, the first metal layer 30 is obtained from the precursor member 32 by patterning the precursor member 32. This patterning process itself is not limited to a specific one, provided that the patterning process is one used in the electronics packaging field. For example, a desired patterning process may be performed by using photolithography in which resist formation, exposure, development, etching, and the like are performed.

Through the above steps, the stretchable flexible substrate 100 according to the present disclosure described above can be finally obtained. That is, it is possible to obtain the stretchable flexible substrate 100 in which the first metal layer 30 and the second metal layer 40 are provided so as to be in contact with both surfaces of the first insulating layer 20 located around the electronic component 10, and the second insulating layer 50 that seals the first insulating layer 20, the electronic component 10, and the second metal layer 40 is provided.

Figure 11H:
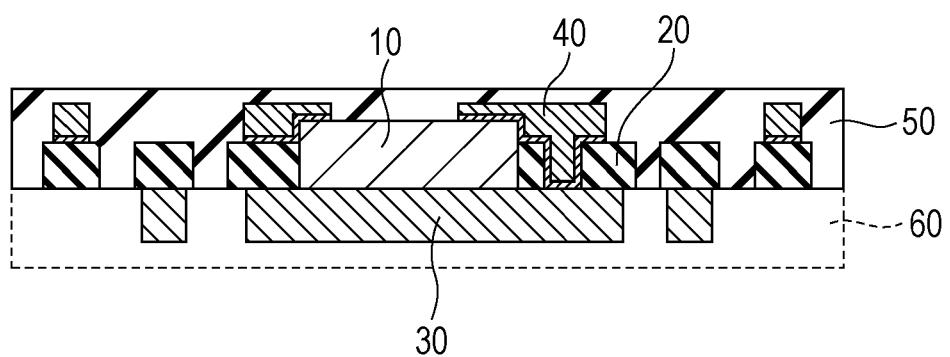
FIG. 11H is a step cross-sectional view schematically illustrating a method for producing the stretchable flexible substrate according to the aspect of the present disclosure.

Note that as illustrated in FIG. 11H, the third insulating layer 60 may be formed so as to seal the first metal layer 30 after the step (v). In particular, the third insulating layer 60 may be formed so as to be stacked on the second insulating layer 50. This can obtain a form in which the electronic component 10, the first insulating layer 20, the first metal layer 30, and the second metal layer 40 are embedded in the second insulating layer 50 and the third insulating layer 60 that are in contact with each other.

In the production method according to the present disclosure, the first insulating layer 20 and the third insulating layer 60 may be formed as resin layers, and the third insulating layer 60 may be made of a softer resin material than the first insulating layer 20. That is, in a case where the first insulating layer 20 is formed as a resin layer containing at least one kind of resin material selected from the group consisting of an acrylic resin, an urethane resin, a silicone resin, a fluorine resin, a polyimide resin, and an epoxy resin, the third insulating layer 60 may be formed as a resin layer containing an elastomer material.

That is, a sealing resin material used for a sealing resin layer which is the third insulating layer 60 may be a material having flexibility such as elastomer, as in the case of the second insulating layer 50. For example, in a case where the sealing resin layer is made of a liquid sealing resin material, the sealing resin layer may be formed through application. Examples of a specific method of application include, but are not limited to, a spin coat method, a roll coat method, a curtain coat method, a spray method, and a liquid droplet ejection method. The sealing resin layer may be formed by forming a sealing resin material prepared in advance as a sheet by thermocompression bonding.

The production method according to the present disclosure can be realized in various aspects. In the aspect illustrated in FIGS. 11A through 11H, the first metal layer 30 is obtained by patterning the precursor member 32 after formation of the second insulating layer 50. However, the order of the processes may be reversed. That is, the second insulating layer 50 may be formed after the first metal layer 30 is formed by patterning the precursor member 32. This means that the step (v) is performed before the step (iv). Production processes according to this aspect are illustrated in FIGS. 12A through 12H.

In the production method illustrated in FIGS. 12A through 12H, (a) a step of obtaining the first metal layer 30 by patterning the precursor member 32, and (b) a step of forming the second insulating layer 50 on the precursor member 32 so that the second insulating layer 50 seals the electronic component 10, the first insulating layer 20, and the second metal layer 40 are performed after the steps (i), (ii), and (iii).

Figure 12A:
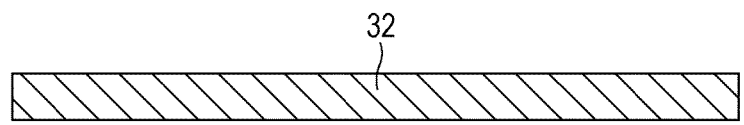
FIG. 12A is a step cross-sectional view schematically illustrating a method for producing a stretchable flexible substrate according to a modified aspect of the present disclosure.
Figure 12B:
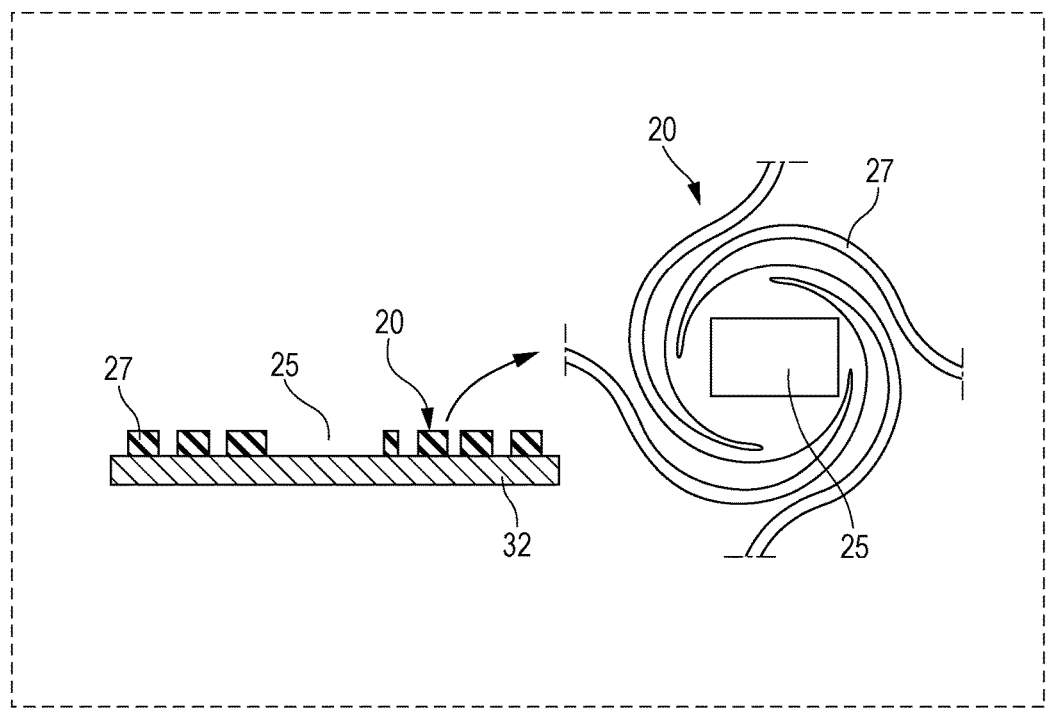
FIG. 12B is a step cross-sectional view schematically illustrating a method for producing the stretchable flexible substrate according to the modified aspect of the present disclosure.
Figure 12C:
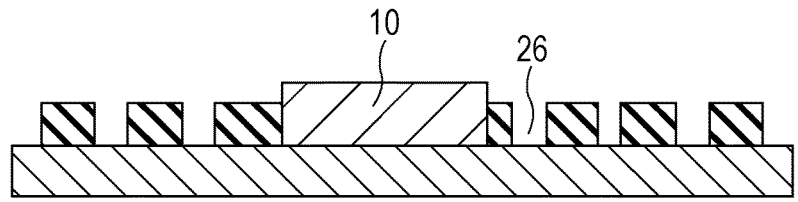
FIG. 12C is a step cross-sectional view schematically illustrating a method for producing the stretchable flexible substrate according to the modified aspect of the present disclosure.
Figure 12D:
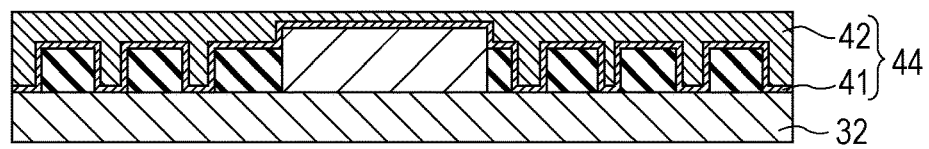
FIG. 12D is a step cross-sectional view schematically illustrating a method for producing the stretchable flexible substrate according to the modified aspect of the present disclosure.
Figure 12E:
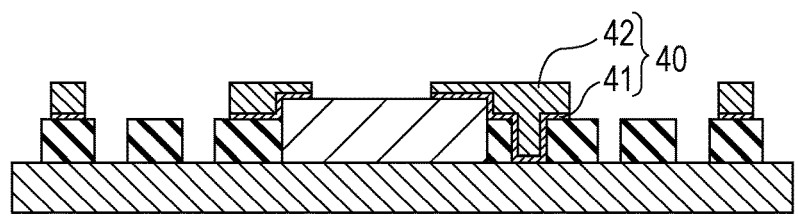
FIG. 12E is a step cross-sectional view schematically illustrating a method for producing the stretchable flexible substrate according to the modified aspect of the present disclosure.
Figure 12F:
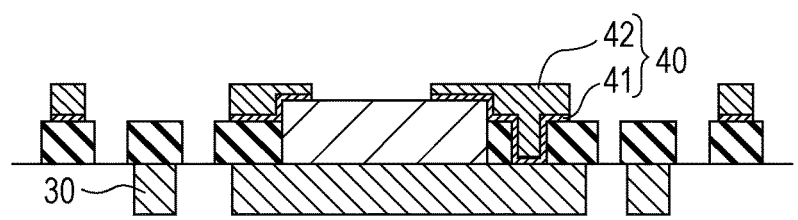
FIG. 12F is a step cross-sectional view schematically illustrating a method for producing the stretchable flexible substrate according to the modified aspect of the present disclosure.
Figure 12G:
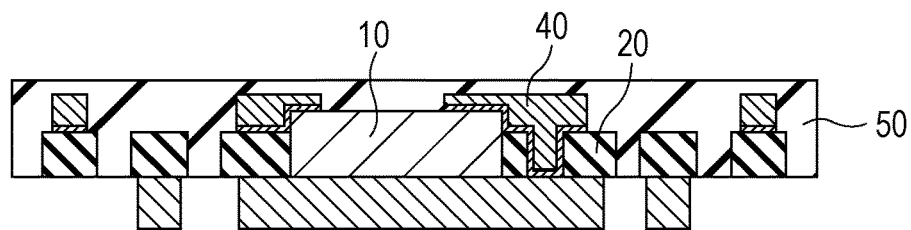
FIG. 12G is a step cross-sectional view schematically illustrating a method for producing the stretchable flexible substrate according to the modified aspect of the present disclosure.
Figure 12H:
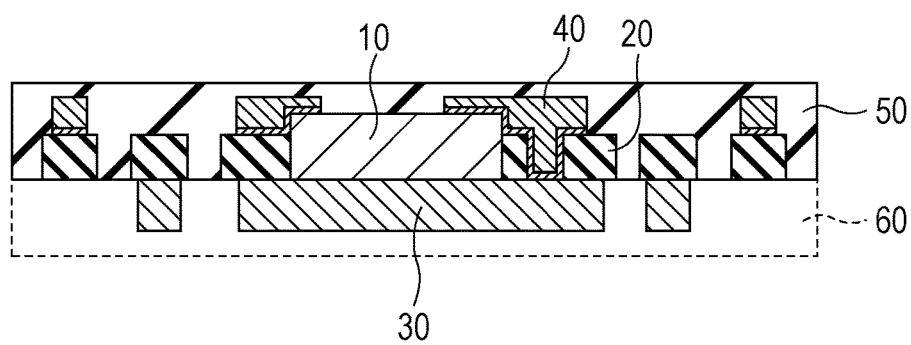
FIG. 12H is a step cross-sectional view schematically illustrating a method for producing the stretchable flexible substrate according to the modified aspect of the present disclosure.
Figure 12I:
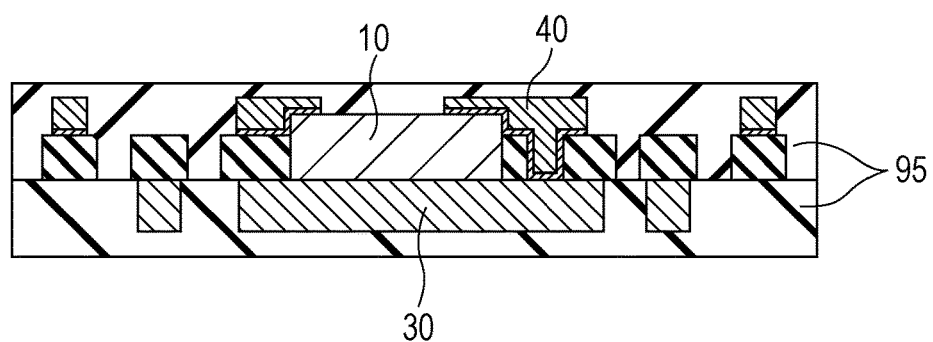
FIG. 12I is a step cross-sectional view schematically illustrating a method for producing the stretchable flexible substrate according to the modified aspect of the present disclosure.

This also can obtain the stretchable flexible substrate 100 (see FIGS. 12G and 12H). That is, it is possible to obtain the stretchable flexible substrate 100 in which the first metal layer 30 and the second metal layer 40 are provided so as to be in contact with both surfaces of the first insulating layer 20 located around the electronic component 10, and the second insulating layer 50 that seals the first insulating layer 20, the electronic component 10, and the second metal layer 40 is provided. Note that, in this aspect, formation of the second insulating layer 50 and formation of the third insulating layer 60 may be performed concurrently. That is, as illustrated in FIGS. 12F and 12I, an insulating layer 95 (e.g., a sealing resin layer) that seals not only the first insulating layer 20, the electronic component 10, and the second metal layer 40, but also the first metal layer 30 in an integrated manner may be formed at one time. Furthermore, in the aspect illustrated in FIGS. 12A through 12H, "a patterning process for obtaining the second metal layer 40" and "a patterning process for obtaining the first metal layer 30" may be performed substantially concurrently. That is, the second metal layer 40 and the first metal layer 30 may be formed collectively by patterning the metal plating layer 44 and the precursor member 32. This means that in a case where the step (v) is performed before the step (iv), "a first patterning process in the step (iii)" and "a second patterning process in the step (v)" are performed collectively or concurrently.

Method for Producing Stretchable Flexible Substrate According to First Embodiment FIGS. 13A through 13I schematically illustrate production processes for obtaining the stretchable flexible substrate 100 according to First Embodiment.

As is clear from the aspect illustrated in FIGS. 13A through 13I, the production processes for obtaining the stretchable flexible substrate 100 according to First Embodiment are similar to those illustrated in FIGS. 11A through 11H described above, but are different in formation of the adhesive layer 70.

Figure 13A:
FIG. 13A is a step cross-sectional view schematically illustrating a method for producing a stretchable flexible substrate according to First Embodiment of the present disclosure.
Figure 13B:
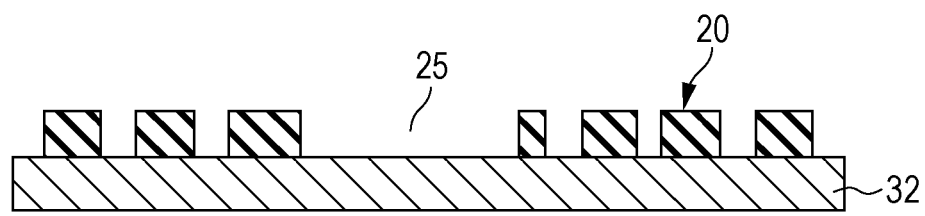
FIG. 13B is a step cross-sectional view schematically illustrating a method for producing the stretchable flexible substrate according to First Embodiment of the present disclosure.
Figure 13C:
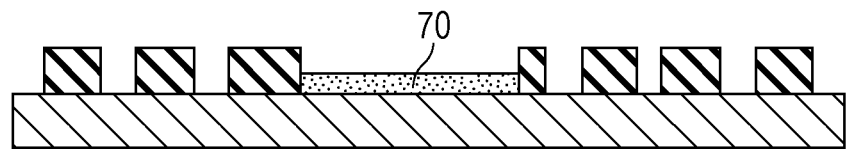
FIG. 13C is a step cross-sectional view schematically illustrating a method for producing the stretchable flexible substrate according to First Embodiment of the present disclosure.
Figure 13D:
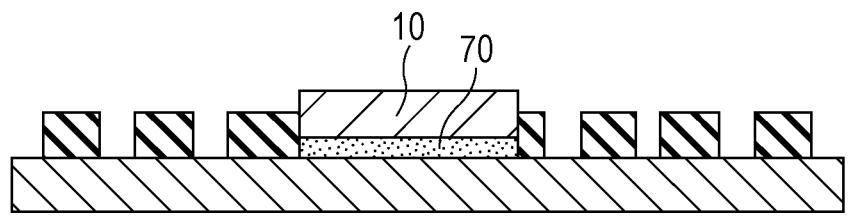
FIG. 13D is a step cross-sectional view schematically illustrating a method for producing the stretchable flexible substrate according to First Embodiment of the present disclosure.
Figure 13E:
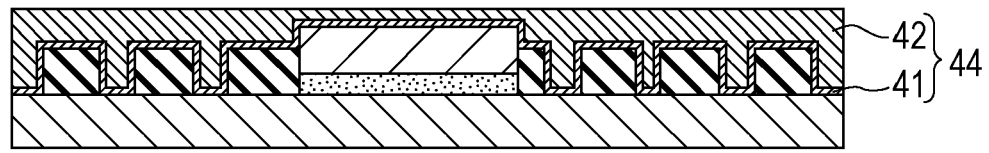
FIG. 13E is a step cross-sectional view schematically illustrating a method for producing the stretchable flexible substrate according to First Embodiment of the present disclosure.
Figure 13F:
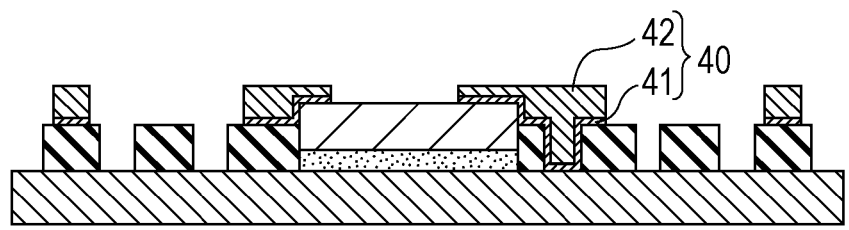
FIG. 13F is a step cross-sectional view schematically illustrating a method for producing the stretchable flexible substrate according to First Embodiment of the present disclosure.
Figure 13G:
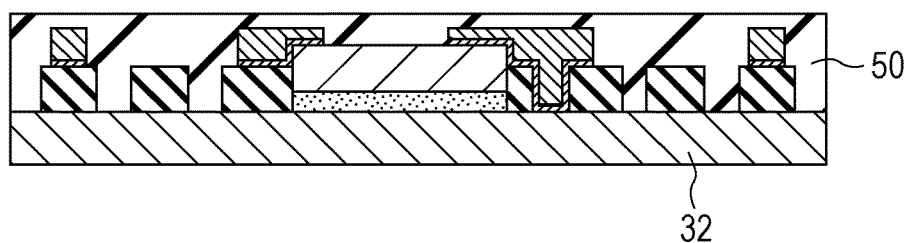
FIG. 13G is a step cross-sectional view schematically illustrating a method for producing the stretchable flexible substrate according to First Embodiment of the present disclosure.
Figure 13H:
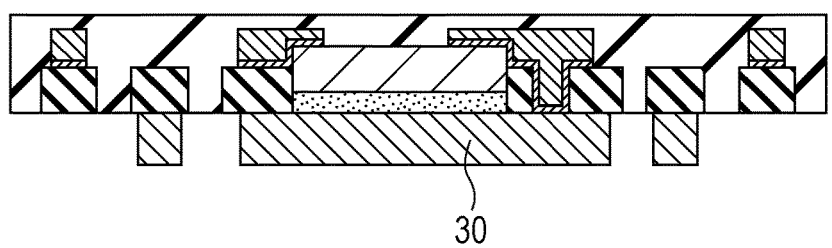
FIG. 13H is a step cross-sectional view schematically illustrating a method for producing the stretchable flexible substrate according to First Embodiment of the present disclosure.
Figure 13I:
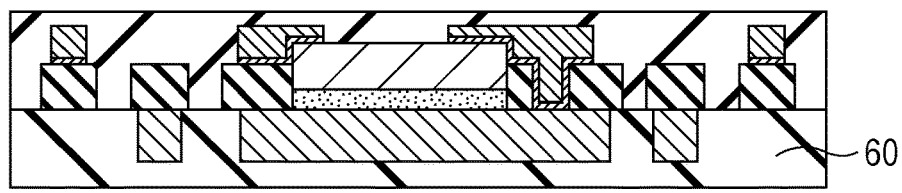
FIG. 13I is a step cross-sectional view schematically illustrating a method for producing the stretchable flexible substrate according to First Embodiment of the present disclosure.

Specifically, in the step (ii), the electronic component 10 is disposed so as to be in contact with the adhesive layer 70 after the adhesive layer 70 is formed in the "hollow region 25" (see FIGS. 13B through 13D). That is, the electronic component 10 is disposed after the adhesive layer 70 is formed in a region of a "recess" formed above the precursor member 32 by the first insulating layer 20. Formation of the adhesive layer 70 itself may be performed by an application method. Examples of the application method include the aforementioned various kinds of printing methods and an application method using a dispenser or the like.

The production processes for obtaining the stretchable flexible substrate 100 according to First Embodiment are similar to those illustrated in FIGS. 11A through 11H described above except for that such a step of forming the adhesive layer 70 is added, and therefore detailed description thereof is omitted to avoid overlapping description.

Method for Producing Stretchable Flexible Substrate According to Second Embodiment FIGS. 14A through 14I schematically illustrate production processes for obtaining the stretchable flexible substrate 100 according to Second Embodiment. As is clear from the aspect illustrated in FIGS. 14A through 14I, the production processes for obtaining the stretchable flexible substrate 100 according to Second Embodiment are similar to those illustrated in FIGS. 11A through 11H described above, but is different not only in formation of the adhesive layer 70, but also in patterning of the precursor member 32.

Figure 14A:
FIG. 14A is a step cross-sectional view schematically illustrating a method for producing a stretchable flexible substrate according to Second Embodiment of the present disclosure.
Figure 14B:
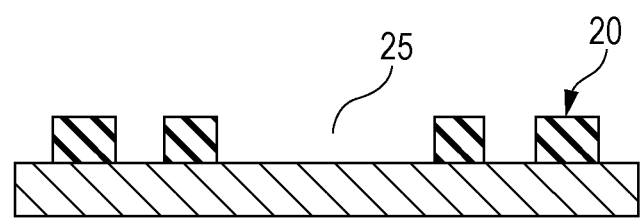
FIG. 14B is a step cross-sectional view schematically illustrating a method for producing the stretchable flexible substrate according to Second Embodiment of the present disclosure.
Figure 14C:
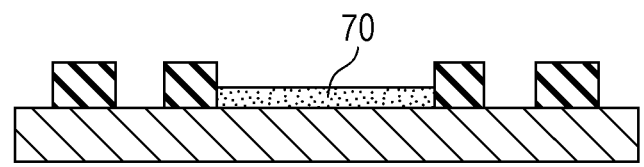
FIG. 14C is a step cross-sectional view schematically illustrating a method for producing the stretchable flexible substrate according to Second Embodiment of the present disclosure.
Figure 14D:
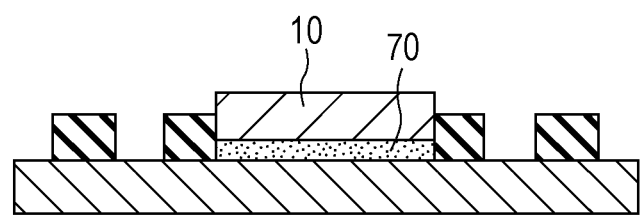
FIG. 14D is a step cross-sectional view schematically illustrating a method for producing the stretchable flexible substrate according to Second Embodiment of the present disclosure.
Figure 14E:
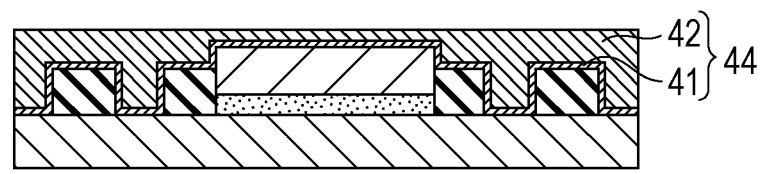
FIG. 14E is a step cross-sectional view schematically illustrating a method for producing the stretchable flexible substrate according to Second Embodiment of the present disclosure.
Figure 14F:
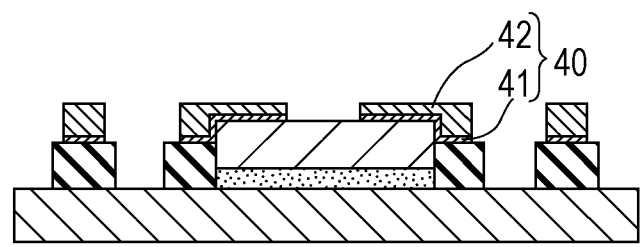
FIG. 14F is a step cross-sectional view schematically illustrating a method for producing the stretchable flexible substrate according to Second Embodiment of the present disclosure.
Figure 14G:
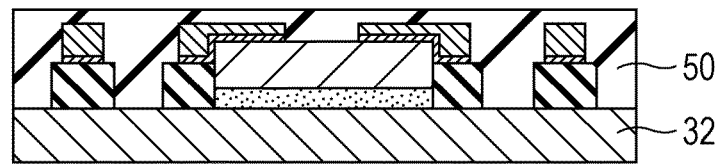
FIG. 14G is a step cross-sectional view schematically illustrating a method for producing the stretchable flexible substrate according to Second Embodiment of the present disclosure.
Figure 14H:
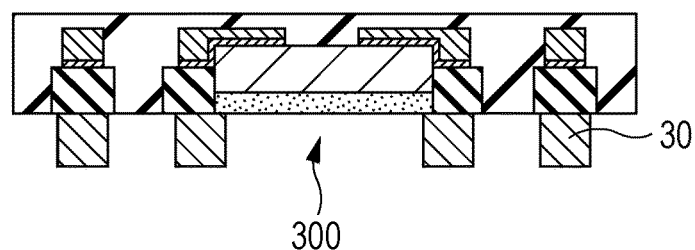
FIG. 14H is a step cross-sectional view schematically illustrating a method for producing the stretchable flexible substrate according to Second Embodiment of the present disclosure.
Figure 14I:
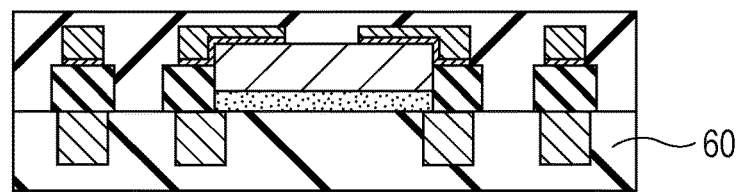
FIG. 14I is a step cross-sectional view schematically illustrating a method for producing the stretchable flexible substrate according to Second Embodiment of the present disclosure.

In particular, in the method for producing the stretchable flexible substrate 100 according to Second Embodiment, a portion of the precursor member 32 that is in the region directly below the electronic component 10 is removed in a process for patterning the precursor member 32. Specifically, as illustrated in FIGS. 14G and 14H, the first metal layer 30 is obtained by removing the region 300 directly below the electronic component 10 in the process for patterning the precursor member 32. This makes it possible to extract light from the lower surface of the electronic component 10.

Note that formation of the adhesive layer 70 is the same as that illustrated in FIGS. 13B through 13D. Note, however, that the adhesive layer 70 may be made of a material having a good optical property. This is because light from the lower surface of the electronic component 10 can be thus more suitably extracted.

The production processes for obtaining the stretchable flexible substrate 100 according to Second Embodiment are similar to those illustrated in FIGS. 11A through 11H described above except for patterning of the precursor member 32 and formation of the adhesive layer 70, and therefore detailed description thereof is omitted to avoid overlapping description.

Figure 15:
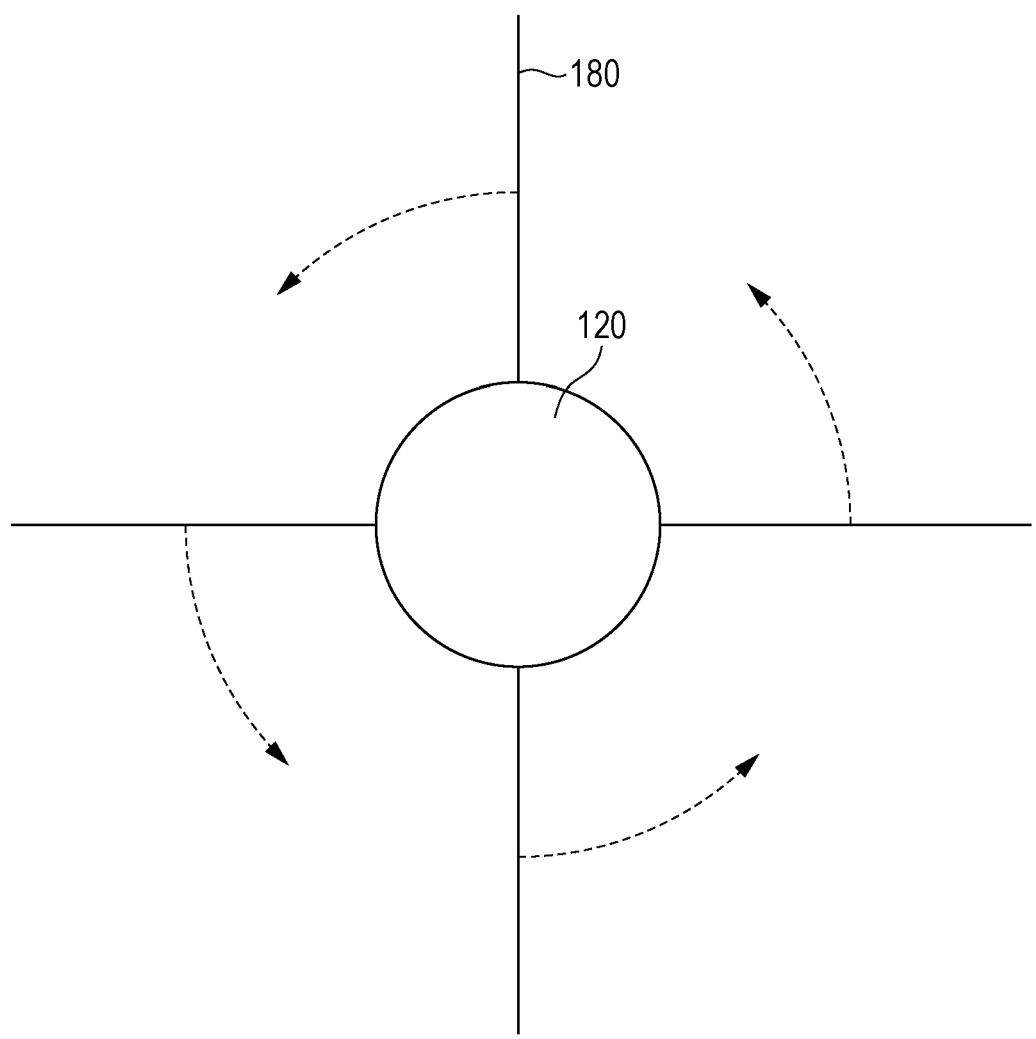
FIG. 15 is a schematic view for explaining an underlying idea forming the basis of the stretchable flexible substrate according to the present disclosure.

Stretchability and Unit Wiring Structure of Substrate According to Present Disclosure Finally, an underlying idea of the inventors of the present disclosure forming the basis of the stretchable flexible substrate according to the present disclosure is additionally described. The inventors of the present disclosure thought of using a "curved" wiring portion instead of a conventional "bent" wiring portion so that stress is distributed in order to solve the problem of a conventional flexible substrate, i.e., a problem that stress is concentrated on one portion, and thereby breaking of wires is likely to occur. That is, the inventors of the present disclosure thought that use of a wiring portion 180 that is curved around the central portion 120, for example, in a counterclockwise direction (or a clockwise direction) as illustrated in FIG. 15 allows stress to be distributed without being concentrated on one portion. Based on this idea, the inventors of the present disclosure accomplished the stretchable flexible substrate according to the present disclosure.

A stretchable flexible substrate according to one aspect of the present disclosure includes one or more unit wiring structures, each of which includes a central portion and a curved wiring portion that is provided outside the central portion. The curved wiring portion is provided so that one end thereof is connected to and extends along an outer periphery of the central portion of the unit wiring structure to which this curved wiring portion belongs and so that the other end is connected, for example, to the curved wiring portion of an adjacent unit wiring structure. In the present embodiment, the curved wiring portion is curved at least partially. For example, in the stretchable flexible substrate 100 illustrated, for example, in FIGS. 1 and 5, the electronic component 10 is mounted in the central portion 120. The electronic component 10 is electrically connected to the curved wiring portion 160 via the electrode pattern 140. The curved wiring portion 160 is curved, for example, by approximately 180 degrees along the outer periphery of the central portion 120. In the present disclosure, an angle of a portion where the curved wiring portion 160 is curved along the outer periphery of the central portion 120 about the center of the central portion 120 can be regarded as a curve central angle. Various angles are possible as the curve central angle. For example, the curved wiring portion 160 may be curved by approximately 30 degrees along the outer periphery of the central portion 120 or may be curved by approximately 90 degrees along the outer periphery of the central portion 120. The curved wiring portion 160 may be curved by approximately 60 degrees or more along the outer periphery of the central portion 120 so that the number of patterns in which an adjacent unit wiring structure is disposed is increased. Furthermore, the curved wiring portion 160 may be curved by approximately 360 degrees or more along the outer periphery of the central portion 120. In a case where the curved wiring portion 160 is curved by approximately 360 degrees or more along the outer periphery of the central portion 120, the curved wiring portion can be more clearly wound along the outer periphery of the central portion 120. In such a case, the curved wiring portion 160 may be wound approximately 1 to 3 times along the outer periphery of the central portion 120. Note that the shape of the central portion 120 is not limited in particular. That is, the shape of the central portion 120 is not limited to the circular shape illustrated in, for example, FIGS. 1 and 5, and can be a polygonal shape such as a rectangular shape or a hexagonal shape. In a case where the shape of the central portion 120 is a polygonal shape, vertexes of the polygon may be round-chamfered in conformity with the curve of the curved wiring portion 160.

As a result of stretch of the stretchable flexible substrate 100, the curvature of the curved wiring portion 160 provided along the outer periphery of the central portion 120 becomes smaller than that before the stretch. The "curvature" as used herein refers to curvature of a curved shape of the curved wiring portion (i.e., "the extent/degree of curve of the curved wiring portion"), and this curvature refers to a reciprocal of a radius of curvature of the curved wiring portion. According to a typical aspect, the curved wiring portion 160 is deformed so that a distance from the outer periphery of the central portion 120 becomes larger from one end toward the other end thereof, and the curvature thereof becomes smaller accordingly, thereby allowing the stretchable flexible substrate 100 to be stretched. Since the stretchable flexible substrate 100 according to the present disclosure is stretched by changing the curvature of the curved wiring portion 160 provided along the outer periphery of the central portion 120, the whole curved wiring portion is deformed, thereby making it possible to distribute stress over the whole curved wiring portion. Therefore, in the stretchable flexible substrate 100 according to the present disclosure, stress is unlikely to concentrate, thereby suppressing occurrence of breaking of wires.

Furthermore, in the stretchable flexible substrate according to the present embodiment, a central angle at which the curved wiring portion 160 is curved along the central portion 120 can be made larger, and the length of the curved wiring portion 160 can be made longer by increasing the number of turns of the curved wiring portion 160. This can give larger stretchability to the stretchable flexible substrate. That is, it is also possible to reduce a substrate dimension in an initial state before stretch.

The stretchable flexible substrate according to the present disclosure has been described above, but the present disclosure is not limited to this. It will be understood that various changes can be made by a person skilled in the art within the scope of the disclosure specified by the claims.

For example, in the method for producing the stretchable flexible substrate according to the present disclosure, a second insulating layer and/or a third insulating layer may be formed only on a portion necessary for a final stretchable flexible substrate, for example, only on an electronic component or a curved wiring portion.

What is claimed is:

1. A stretchable flexible substrate comprising: an electronic component; a first insulating layer that is located around the electronic component and has a first main surface and a second main surface that face each other; a first metal layer that is in contact with the first main surface; a second metal layer that is in contact with the second main surface and is electrically connected to the electronic component; and a second insulating layer that seals the electronic component, the first insulating layer, and the second metal layer, wherein:
in a plan view, at least one curved wiring portion extends from a central portion, the central portion being made up of at least the electronic component, a first portion of the first insulating layer, a first portion of the first metal layer and a first portion of the second metal layer, and the at least one curved wiring portion being made up of at least a second portion of the first insulating layer that is different from the first portion, a second portion of the first metal layer that is different from the first portion, and a second portion of the second metal layer that is different from the first portion; and the at least one curved wiring portion is curved at least partially in a spiral shape having an axis at the central portion; wherein the stretchable flexible substrate is stretchable due to a change in curvature of the at least one curved wiring portion.

2. The stretchable flexible substrate according to claim 1, wherein
in the central portion, the electronic component is surrounded by the first portion of the first insulating layer.

3. The stretchable flexible substrate according to claim 1, further comprising an adhesive layer that is provided between the electronic component and the first metal layer and is in contact with the electronic component.

4. The stretchable flexible substrate according to claim 1, wherein
the first metal layer is a metal foil.

5. The stretchable flexible substrate according to claim 1, wherein
both of the first insulating layer and the second insulating layer are each a resin layer; and
the second insulating layer is softer than the first insulating layer.

6. The stretchable flexible substrate according to claim 1, further comprising a third insulating layer that seals the first metal layer, wherein
the second insulating layer is stacked on the third insulating layer.

7. The stretchable flexible substrate according to claim 6, wherein
the first metal layer is flush with a boundary face between the second insulating layer and the third insulating layer.

8. The stretchable flexible substrate according to claim 6, wherein
the first insulating layer is flush with a boundary face between the second insulating layer and the third insulating layer.

9. The stretchable flexible substrate according to claim 3, further comprising a third insulating layer that seals the first metal layer, wherein:
the second insulating layer is stacked on the third insulating layer; and
the adhesive layer is flush with a boundary face between the second insulating layer and the third insulating layer.

10. The stretchable flexible substrate according to claim 6, wherein
both of the first insulating layer and the third insulating layer are each a resin layer; and
the third insulating layer is softer than the first insulating layer.

11. The stretchable flexible substrate according to claim 1, further comprising a gap that passes through the first insulating layer, wherein
the first metal layer and the second metal layer are electrically connected to each other through the gap.

12. The stretchable flexible substrate according to claim 11, wherein
the gap is filled with the second metal layer.

* * * * *